(12) United States Patent
Miao et al.

(10) Patent No.: US 11,568,778 B2
(45) Date of Patent: Jan. 31, 2023

(54) GATE DRIVING CIRCUIT AND DRIVING METHOD THEREOF AND DISPLAY PANEL

(71) Applicants: BEIJING BOE DISPLAY TECHNOLOGY CO., LTD., Beijing (CN); BOE TECHNOLOGY GROUP CO., LTD., Beijing (CN)

(72) Inventors: Yingmeng Miao, Beijing (CN); Changchen Liu, Beijing (CN); Zhihua Sun, Beijing (CN); Yanping Liao, Beijing (CN); Seungmin Lee, Beijing (CN); Xibin Shao, Beijing (CN); Cong Wang, Beijing (CN); Feng Qu, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/351,638

(22) Filed: Jun. 18, 2021

(65) Prior Publication Data

US 2022/0101769 A1    Mar. 31, 2022

(30) Foreign Application Priority Data

Sep. 30, 2020    (CN) .......................... 202011068583.3

(51) Int. Cl.
*G09G 3/20*    (2006.01)
*G11C 19/28*    (2006.01)

(52) U.S. Cl.
CPC .............. *G09G 3/20* (2013.01); *G11C 19/28* (2013.01); *G09G 2300/0408* (2013.01); *G09G 2300/08* (2013.01); *G09G 2310/0243* (2013.01); *G09G 2310/0267* (2013.01); *G09G 2310/0286* (2013.01); *G09G 2310/08* (2013.01)

(58) Field of Classification Search
CPC ............ G09G 3/20; G09G 2300/0408; G09G 2300/08; G09G 2310/0243; G09G 2310/0267; G09G 2310/0286; G09G 2310/08; G11C 19/28
See application file for complete search history.

(56) References Cited

U.S. PATENT DOCUMENTS

2006/0007085 A1*   1/2006   Kim ..................... G09G 3/3677
                                                                                345/87
2007/0147573 A1*   6/2007   Tobita .................. G09G 3/3677
                                                                                377/64

(Continued)

*Primary Examiner* — Sejoon Ahn
(74) *Attorney, Agent, or Firm* — Westman, Champlin & Koehler, P.A.

(57) ABSTRACT

According to the embodiments of the present disclosure, there is provided gate driving circuit comprising 2N stages of shift registers, the 2N stages of shift registers comprising N first shift registers arranged alternately with N second shift registers, wherein the N first shift registers are cascaded-coupled as N stages of first shift registers, and are configured to generate N first output signals under control of K first clock signals; and wherein the N second shift registers are cascaded-coupled as N stages of second shift registers, and are configured to generate N second output signals under a control of K second clock signals, wherein K and N are both integers greater than 1, and K≤N.

14 Claims, 20 Drawing Sheets

(56) References Cited

U.S. PATENT DOCUMENTS

2007/0171179 A1* 7/2007 Morosawa ............. G11C 19/00
　　　　　　　　　　　　　　　　　　　345/100
2008/0055293 A1* 3/2008 Kuo ....................... G11C 19/28
　　　　　　　　　　　　　　　　　　　345/204
2019/0237031 A1* 8/2019 Cho ..................... G09G 3/3677

* cited by examiner

The 2N stages of shift registers are turned on in a first mode, so that the N first shift registers of the 2N stages of shift registers generate the N first output signals under the control of the K first clock signals; and the N second shift registers of the 2N stages of shift registers generate the N second output signals under the control of the K second clock signals ⎯ S1001

The N first shift registers are turned on in a second mode, so that the N first shift registers generate the N first output signals under the control of the K first clock signals, and the N first output signals are shifted sequentially, or the N second shift registers are turned on in the second mode, so that the N second shift registers generate the N second output signals under the control of the K second clock signals, and the N second output signals are shifted sequentially ⎯ S1002

FIG. 10

GATE DRIVING CIRCUIT AND DRIVING METHOD THEREOF AND DISPLAY PANEL

CROSS-REFERENCE TO RELATED APPLICATION(S)

This application claims priority to the Chinese Patent Application No. 202011068583.3, filed on Sep. 30, 2020, which is incorporated herein by reference in its entirety.

TECHNICAL FIELD

The present disclosure relates to a field of display technology, and in particular to a gate driving circuit, a driving method thereof, and a display panel.

BACKGROUND

In the display technology, a gate driver on array (GOA) technology is usually used to realize a gate driving circuit. In the GOA technology, the gate driving circuit is provided on an array substrate, which may drive gates of each pixel in a pixel area without additionally binding a gate driving chip. Generally, each shift register in the gate driving circuit is cascaded-coupled. In this way, each shift register generates a gate driving signal that shifts sequentially, so as to turn on sub-pixels in the pixel area row by row. However, a structure of a traditional gate driving circuit leads to limitations in a display.

SUMMARY

According to the embodiments of the present disclosure, there is provided a gate driving circuit including 2N stages of shift registers, the 2N stages of shift registers including N first shift registers arranged alternately with N second shift registers, wherein the N first shift registers are cascaded-coupled as N stages of first shift registers, and are configured to generate N first output signals under control of K first clock signals; and wherein the N second shift registers are cascaded-coupled as N stages of second shift registers, and are configured to generate N second output signals under a control of K second clock signals, wherein K and N are both integers greater than 1, and K≤N.

For example, an input signal terminal of an n-th stage of first shift register in the N stages of first shift registers is coupled to an output signal terminal of an (n−i)-th stage of first shift register in the N stages of first shift registers, and a reset signal terminal of the n-th stage of first shift register is coupled to an output signal terminal of an (n+j)-th stage of first shift register in the N stages of first shift registers; and an input signal terminal of an n-th stage of second shift register in the N stages of second shift registers is coupled to an output signal terminal of an (n−i)-th stage of second shift register in the N stages of second shift registers, and a reset signal terminal of the n-th stage of second shift register is coupled to an output signal terminal of an (n+j)-th stage of second shift register in the N stages of second shift registers, wherein n, i, and j are all integers greater than 0, K is an even number, 1<n<N, 1≤i≤K/2, and K/2+1≤j≤K−1.

For example, K=6, i=3, and j=4.
For example, K=4, i=2, and j=3.
For example, K=8, i=4, and j=5.

For example, input signal terminals of first to i-th stages of first shift registers in the N stages of first shift registers are configured to receive a first turn-on signal; and input signal terminals of first to i-th stages of second shift registers in the N stages of second shift registers are configured to receive a second turn-on signal.

For example, reset signal terminals of (N−j+1)-th to N-th stages of first shift registers in the N stages of first shift registers and reset signal terminals of the (N−j+1)-th to the N-th stages of second shift registers in the N stages of second shift registers are configured to receive a total reset signal.

For example, the first shift registers are odd-numbered stages of shift registers in the 2N stages of shift registers, and the second shift registers are even-numbered stages of shift registers in the 2N stages of shift registers.

For example, the N first shift registers are divided into at least one group of K cascaded first shift registers, and clock signal terminals of the K cascaded first shift registers are configured to receive the K first clock signals respectively; and the N second shift registers are divided into at least one group of K cascaded second shift registers, and clock signal terminals of the K cascaded second shift registers are configured to receive the K second clock signals respectively.

For example, each of the first shift registers is configured to output a first output signal at an output signal terminal of said each of the first shift registers based on a signal of an input signal terminal of said each of the first shift registers under control of a first clock signal received by a clock signal terminal of said each of the first shift registers, and reset a pull-up node of said each of the first shift registers under control of a signal of a reset signal terminal of said each of the first shift registers; and each of the second shift registers is configured to output a second output signal at an output signal terminal of said each of the second shift registers based on a signal of an input signal terminal of said each of the second shift registers under control of a second clock signal received by a clock signal terminal of said each of the second shift registers, and reset a pull-up node of said each of the second shift registers under control of a signal of a reset signal terminal of said each of the first shift registers.

For example, each of the first shift registers is further configured to reset a pull-up node of said each of the first shift registers under control of a signal of a total reset terminal of said each of the first shift registers; and each of the second shift registers is further configured to reset a pull-up node of said each of the second shift registers under control of a signal of a total reset terminal of said each of the second shift registers, wherein the total reset terminals of the N first shift registers and the total reset terminals of the N second shift registers are configured to receive a total reset signal.

According to the embodiments of the present disclosure, there is further provided a display panel including the gate driving circuit mentioned above.

According to the embodiments of the present disclosure, there is further provided a method of driving the gate driving circuit mentioned above, including:

in a first mode, turning on the 2N stages of shift registers, so that the N first shift registers of the 2N stages of shift registers generate the N first output signals under control of the K first clock signals; and the N second shift registers of the 2N stages of shift registers generate the N second output signals under control of the K second clock signals; and in a second mode, turning on the N first shift registers, so that the N first shift registers generate the N first output signals under control of the K first clock signals, wherein the N first output signals are shifted sequentially, or turning on the N second shift registers in the second mode, so that the N second shift registers generate the N second output signals under control of the K second clock signals, wherein the N second output signals are shifted sequentially.

For example, in the second mode, the turning on the N first shift registers includes: applying a valid first turn-on signal to the first to i-th stages of first shift registers in the N first shift registers, and applying an invalid second turn-on signal to the first to i-th stages of second shift registers in the N second shift registers; and the turning on the N second shift registers includes: applying a valid second turn-on signal to the first to i-th stages of second shift registers in the N second shift registers, and applying an invalid first turn-on signal to the first to i-th stages of first shift registers in the N first shift registers, wherein i is an integer and $1 \leq i \leq K/2$.

BRIEF DESCRIPTION OF THE ACCOMPANYING DRAWINGS

FIG. 10 shows a flowchart of a method of driving a gate driving circuit according to some embodiments of the present disclosure.

Figure 13:
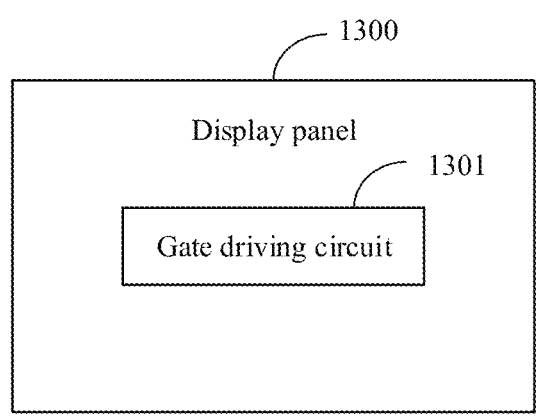

FIG. 13 schematically shows a block diagram of a display device according to some embodiments of the present disclosure.

DETAILED DESCRIPTION

The present disclosure will be described with reference to the accompanying drawings containing optional embodiments of the present disclosure, but it should be understood that those of ordinary skill in the art may modify the disclosure described herein while obtaining technical effects of the present disclosure. Therefore, it should be understood that the description above is a broad disclosure for those of ordinary skill in the art, and the content is not intended to limit the exemplary embodiments described in the present disclosure.

In addition, in a following detailed description, for a convenience of explanation, many specific details are set forth to provide a comprehensive understanding of the embodiments of the present disclosure. However, obviously, one or more embodiments may further be implemented without these specific details. In other cases, well-known structures and devices are embodied in an illustrative manner to simplify the drawings.

Figure 1A:
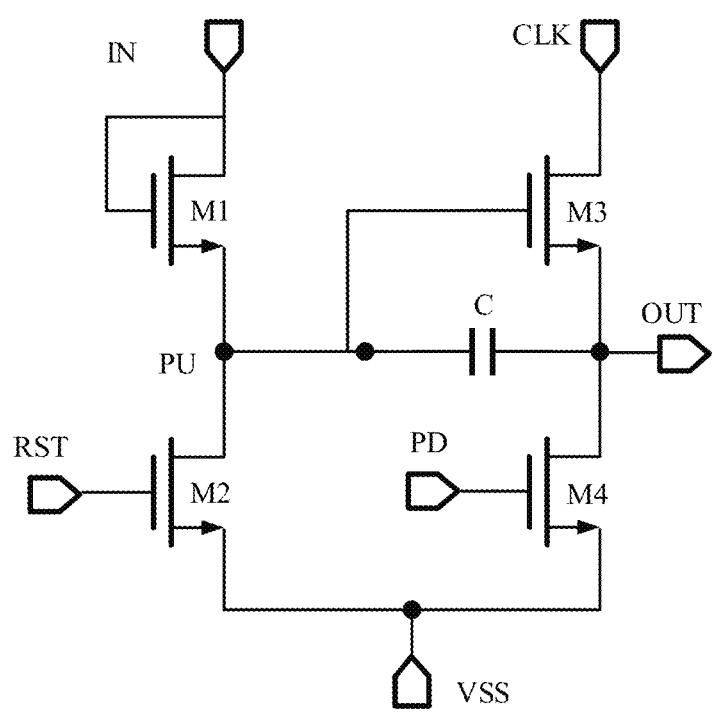
FIG. 1A shows a circuit diagram of a shift register according to some embodiments of the present disclosure.

FIG. 1A shows a circuit diagram of a shift register according to some embodiments of the present disclosure. As shown in FIG. 1A, the shift register 100 includes an input signal terminal IN, an output signal terminal OUT, a pull-up node PU, a clock signal terminal CLK, and a reset signal terminal RST. The shift register 100 may provide a signal of the input signal terminal IN to the pull-up node PU. An output signal may be generated, under control of a potential of the pull-up node PU, at the output signal terminal OUT based on a signal of the clock signal terminal CLK. The pull-up node PU may be reset under control of a signal of the reset signal terminal RST. The shift register 100 may further include a pull-down node PD. The output signal terminal OUT may be pulled down to a potential of a reference signal terminal VSS under control of the pull-down node PD. In FIG. 1A, the shift register 100 includes transistors M1, M2, M3, and M4 and a capacitor C, and the transistors M1, M2, M3, and M4 are all N-type transistors. However, this is only for explaining a basic working principle of the shift register, and the embodiments of the present disclosure are not limited thereto. The shift register 100 may have any other structure as required. For example, the shift register 100 may further include other circuits such as a control circuit and a noise reduction circuit. There may be a plurality of pull-down circuits in the shift register 100, which are used to pull down potentials of different nodes of the shift register 100. The plurality of transistors may be P-type transistors. Alternatively, some of the plurality of transistors may be N-type and some of the plurality of transistors may be P-type.

Figure 1B:
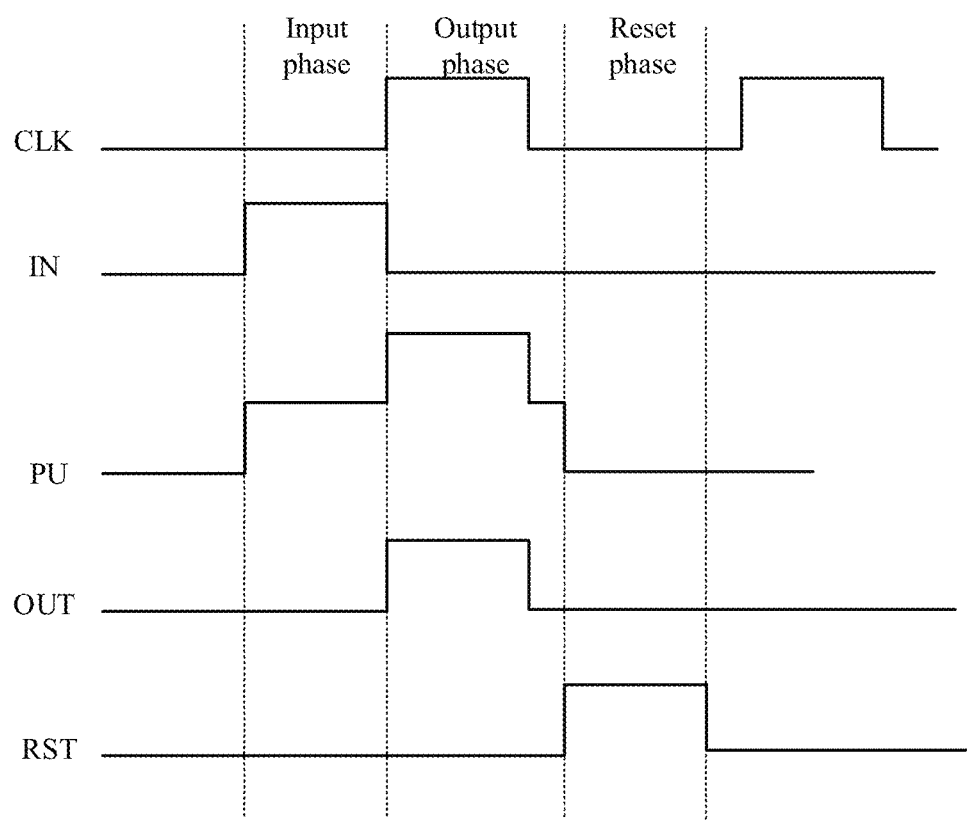
FIG. 1B shows a working principle diagram of the shift register in FIG. 1A.

FIG. 1B shows a working principle diagram of the shift register in FIG. 1A.

As shown in FIG. 1B, in an input phase, when the input signal terminal IN is at a high level, the transistor M1 is turned on. Thus, the high level of the input signal terminal IN is input to the pull-up node PU, so that the transistor M3 is turned on. Since the clock signal terminal CLK is at a low level, the output signal terminal OUT outputs a low level.

In a first sub-period of an output phase, a high level comes to the clock signal terminal CLK. The pull-up node PU maintains the high level due to the capacitor C, and the transistor M3 remains in a conductive state. Thus, the high level of the clock signal terminal CLK is provided to the output signal terminal OUT, A bootstrap of the capacitor C further increases the potential of the pull-up node PU. In a second sub-period of the output phase, the clock signal terminal CLK changes from a high level to a low level. At this time instant, the transistor M3 still remains in the conductive state, and the output signal terminal OUT further changes to a low level.

In a reset phase, the reset signal terminal RST is at a low level, and the transistor M2 is turned on. Thus, the pull-up node PU is pulled down to a low level of the reference signal terminal VSS. A potential of the pull-down node PD may be controlled by the pull-up node PU. For example, if the pull-up node PU is at a high level, then the pull-down node PD is at a low level, and the transistor M4 is turned off; and if the pull-up node PU is at a low level, then the pull-down node PD is at a high level and the transistor M4 is turned on, thereby pulling down the output signal terminal OUT to a low level.

Figure 1C:
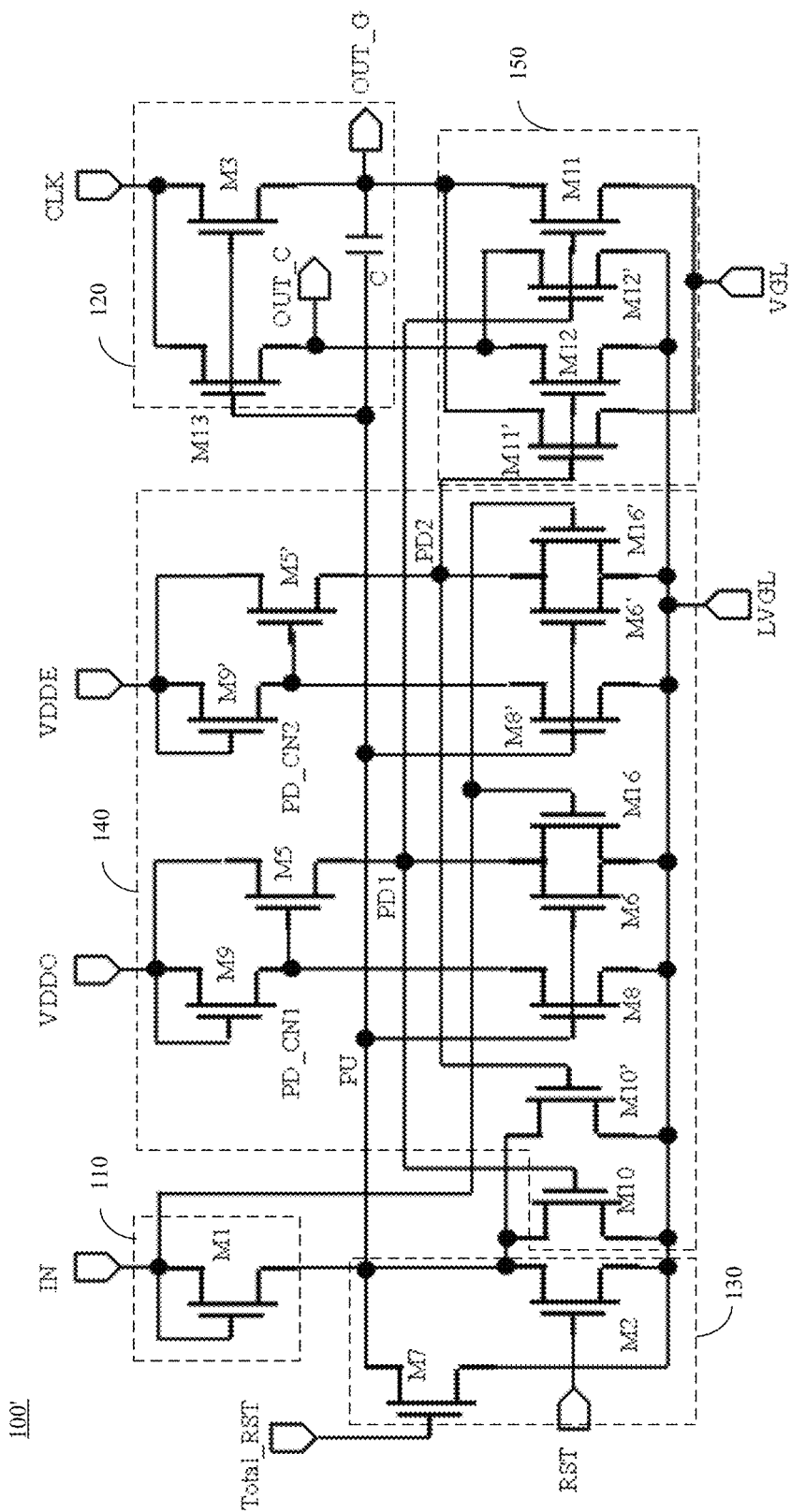
FIG. 1C shows a circuit diagram of a shift register according to some embodiments of the present disclosure.

FIG. 1C shows a circuit diagram of a shift register according to some embodiments of the present disclosure. As shown in FIG. 1C, the shift register 100' includes an input circuit 110, an output circuit 120, and a reset circuit 130.

The input circuit 110 includes a transistor M1, which may input a signal of an input signal terminal IN to a pull-up node PU.

The output circuit 120 includes transistors M3, M13 and a capacitor C. When the pull-up node PU is at a high level, the transistors M3 and M13 are turned on. Thus, a clock signal of a clock signal terminal CLK is provided to output signal terminals OUT_C and OUT_G, respectively. The output signal terminal OUT_C may be used to couple with other shift registers, and the output signal terminal OUT_G is used to provide gate driving signals to sub-pixels in a display area.

The reset circuit 130 may include transistors M2 and M7. When a reset signal terminal RST is at a high level, the transistor M2 is turned on. The pull-up node PU is reset to a low level of a reference signal terminal LVGL. When a total reset terminal Total_RST is at a high level, the transistor M7 is turned on. The pull-up node PU is reset. The reset signal terminal RST may be used to couple with other shift registers; and the total reset terminal Total_RST is configured to receive a total reset signal to realize a total reset of the gate driving circuit.

The shift register 100' may further include a control circuit 140 and a pull-down circuit 150.

The control circuit 140 may include a first sub-circuit and a second sub-circuit. The first sub-circuit includes transistors M5, M6, M8, M9, and M16, and the second sub-circuit includes transistors M5', M6', M8', M9', and M16'. The first sub-circuit may control a potential of a first pull-down node PD1 according to a potential of the pull-up node PU, and the second sub-circuit may control a potential of a second pull-down node PD2 according to the potential of the pull-up node PU. For example, when the pull-up node PU is at a low level, the transistors M6 and M8 are turned off and the transistor M9 is turned on. Thus, a node PD_CN1 is at a high level, so that the transistor M5 is turned on, and the first pull-down node is at a high level. When the pull-up node PU is at a high level, the transistors M6 and M8 are turned on to pull down the node PD_CN1 and the first pull-down node PD1 to a low level, and the transistor M5 is turned off. Therefore, the first pull-down node PD1 maintains the low level. The second sub-circuit works in a similar manner, and will not be repeated here. The control circuit 140 may further include transistors M10 and M10'. When the first pull-down node PD1 is at a high level, the transistor M10 is turned on, and the pull-up node PU is pulled down to a low level. When the second pull-down node PD2 is at a high level, the transistor M10' is turned on, and the pull-up node PU is pulled down to a low level.

The pull-down circuit 150 may include transistors M11, M12, M11', and M12'. When the first pull-down node PD1 is at a high level, the transistors M11 and M12 are turned on, and the output signal terminals OUT_G and OUT_C are pulled down to a low level respectively. When the second pull-down node PD2 is at a high level, the transistors M11' and M12' are turned on, and the output signal terminals OUT_G and OUT_C are pulled down to a low level respectively.

Figure 2:
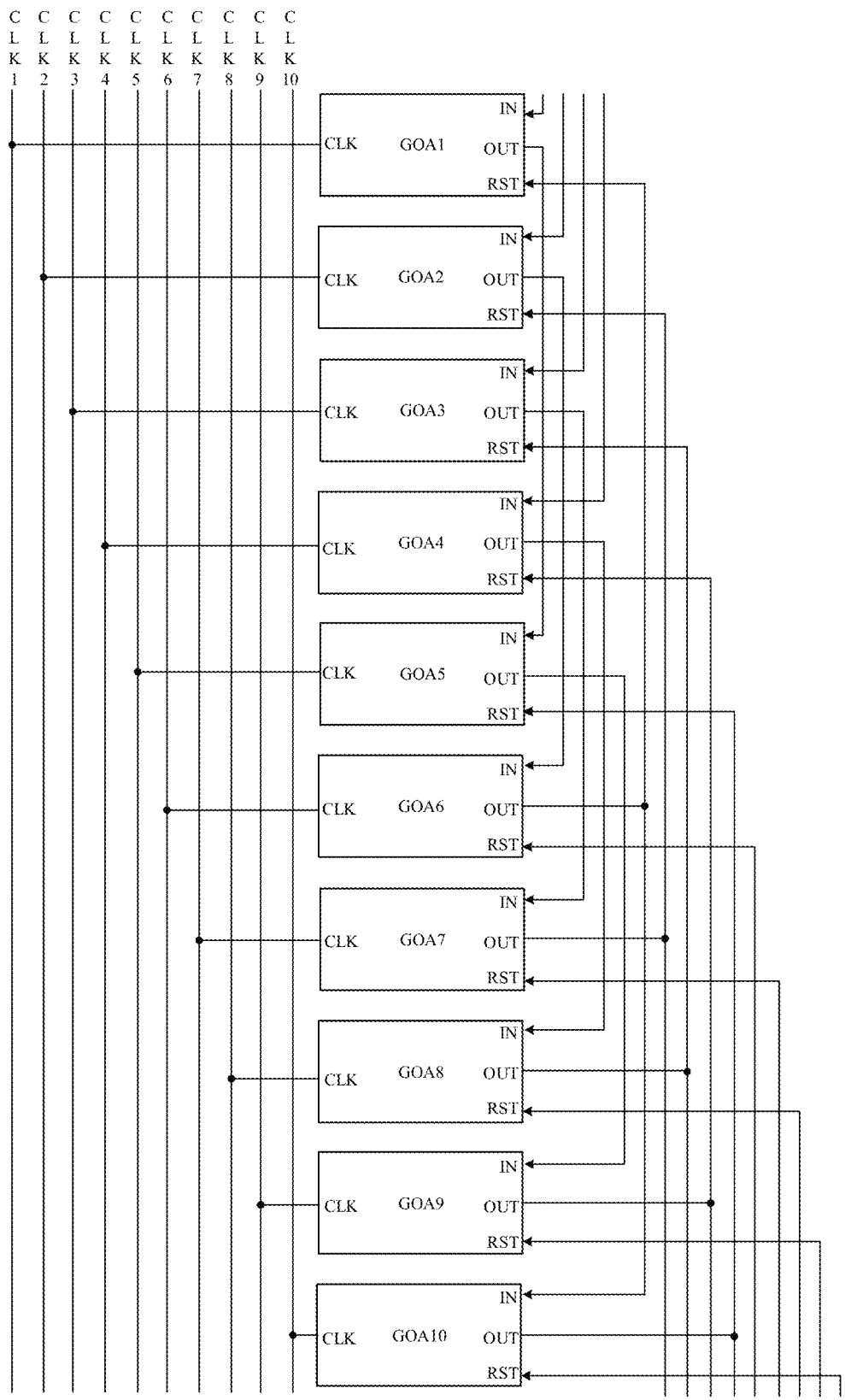
FIG. 2 shows a structure diagram of a gate driving circuit.

FIG. 2 shows a structure diagram of a gate driving circuit. As shown in FIG. 2, the gate driving circuit includes a plurality of stages of cascaded-coupled shift registers GOA1, GOA2, GOA3, . . . GOA10. For brevity, FIG. 2 shows 10 stages of shift registers GOA1 to GOA10. The gate driving circuit in FIG. 2 is controlled by 10 clock signals CLK1, CLK2, . . . , CLK10, and clock signal terminals of the shift registers GOA1 to GOA10 are configured to receive the clock signals CLK1 to CLK10 respectively. In a similar manner, clock signal terminals of the shift registers GOA11 to GOA20 are configured to receive clock signals CLK1 to CLK10 respectively. In the gate driving circuit of FIG. 2, an input signal terminal IN of the n-th stage of shift register GOAn is coupled to an output signal terminal OUT of the (n−4)-th stage of shift register GOA(n−4). A reset signal terminal RST of the n-th stage of shift register GOAn is coupled to an output signal terminal OUT of the (n+5)-th stage of shift register GOA(n+5). n is an integer greater than or equal to 5. For example, an output signal terminal OUT of the first stage of shift register GOA1 is coupled to an input signal terminal IN of the fifth stage of shift register GOA5, and an output signal terminal OUT of the second stage of shift register GOA2 is coupled to an input signal terminal IN of the sixth stage of shift register GOA6, etc. A reset signal terminal RST of the first stage of shift register GOA1 is coupled to an output signal terminal OUT of the sixth stage of shift register GOA6, and a reset signal terminal RST of the second stage of shift register GOA2 is coupled to an output signal terminal OUT of the seventh stage of shift register GOAT, etc. Input signal terminals IN of the first to the fourth stages of shift registers GOA1 to GOA4 may be configured to receive a turn-on signal.

Generally, the clock signals CLK1 to CLK10 are provided to sequentially shift the output signals generated by the shift registers GOA1 to GOA10, so as to scan the sub-pixels of the display area line by line. In this manner, the display area may be displayed in a full resolution. For example, an 8K resolution display panel may be displayed in 8K resolution. However, this is not suitable for low-resolution display, for example, a 4K resolution display cannot be performed on an 8K display panel.

In order to achieve display in different resolutions on the same display panel, gate driving may be performed in two modes. For example, the sub-pixels may be scanned line by line in a first mode, so as to achieve the full-resolution display. The sub-pixels may be scanned two rows by two rows in a second mode, so as to achieve the low-resolution display. This method will be described below with reference to FIGS. 3A and 3B.

Figure 3A:
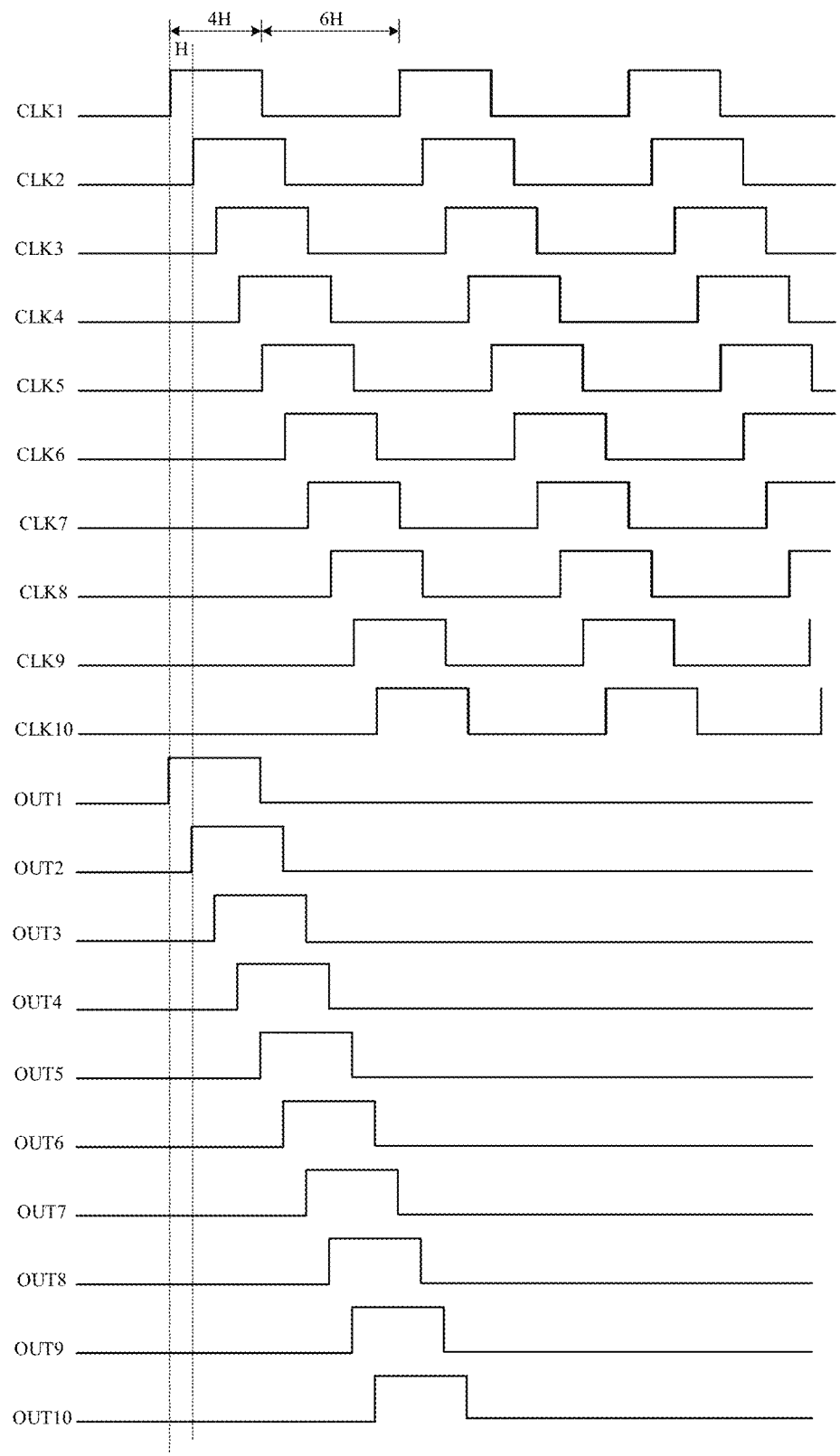
FIGS. 3A and 3B show signal timing diagrams of a method of driving a gate driving circuit in a first mode and a second mode respectively.
Figure 3B:
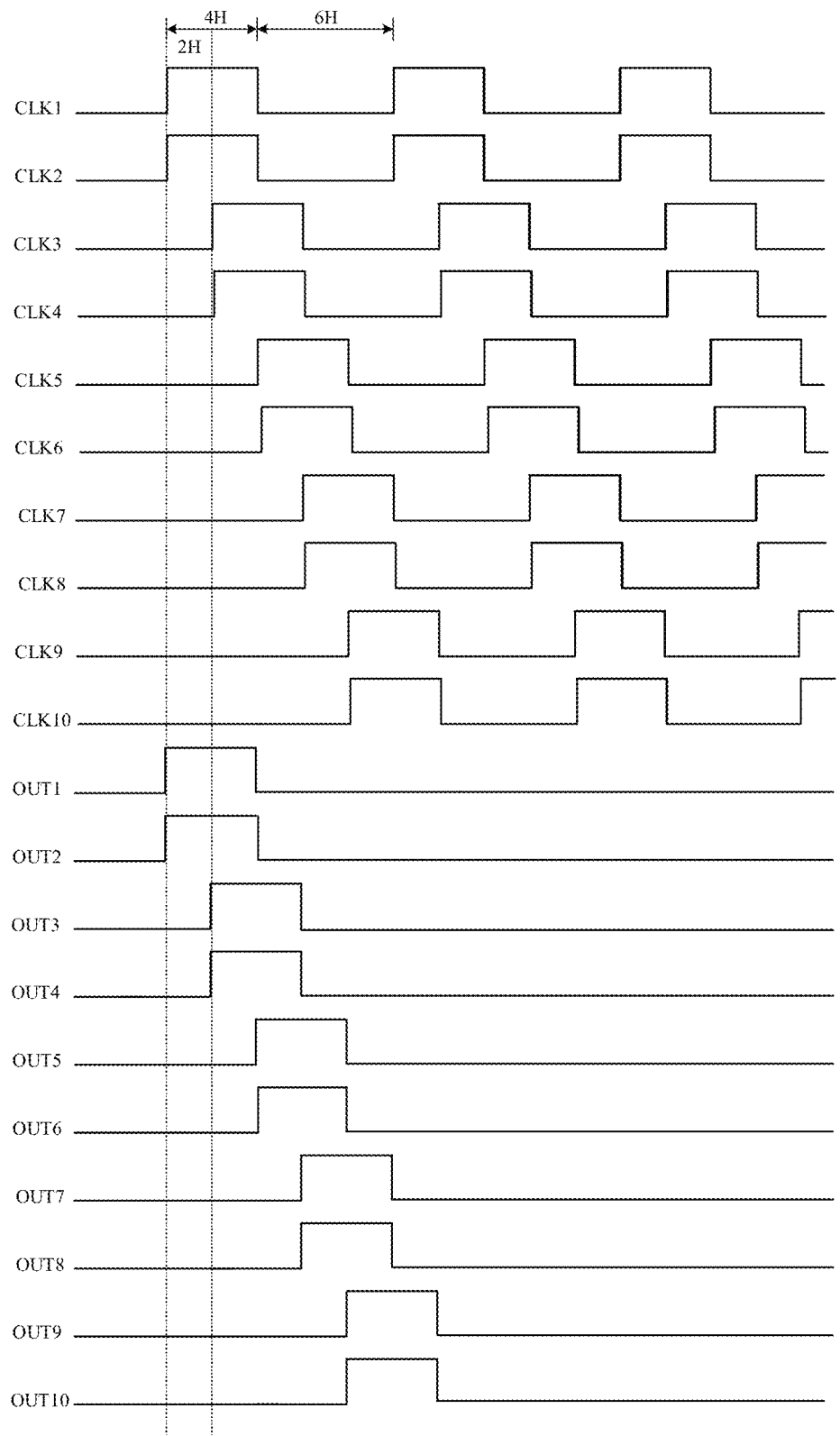

FIG. 3A shows a signal timing diagram of a method of driving a gate driving circuit in the first mode according to some embodiments of the present disclosure. FIG. 3B shows a signal timing diagram of a method of driving a gate driving circuit in the second mode according to some embodiments of the present disclosure.

As shown in FIGS. 3A and 3B, a high-level duty cycle of the clock signals CLK1 to CLK10 is 40%, a high-level duration is 4H, and a low-level duration is 6H. H represents a unit scan time, that is, a duration for the gate driving circuit to scan a row of pixels. Taking the 8K resolution display panel as an example, the sub-pixels in the display area of the display panel are in a 7680×4320 array. It is assumed that a refresh frequency is 60 Hz. A scanning duration for 1 frame is 1/60 second, that is, it takes 1/60 second to scan 4320 rows of sub-pixels. A duration for scanning each row of sub-pixels (that is, the unit scan time) H=1/60÷4320≈3.7 μs. Similarly, if the refresh frequency is 120 Hz, then the unit scan time H is about 1.85 μs.

In the first mode, as shown in FIG. 3A, the (k+1)-th clock signal is shifted by H relative to the k-th clock signal. For example, the clock signal CLK2 (the second clock signal) is shifted by H relative to the clock signal CLK1 (the first clock signal). The clock signal CLK3 (the third clock signal) is shifted by H relative to the clock signal CLK2 (the second clock signal), etc. Taking the gate driving circuit of FIG. 2 as an example, according to the working principle of the shift register described above, this setting for the clock signals CLK1 to CLK10 may make an output signal OUT (n+1) generated by the (n+1)-th stage of shift register GOA(n+1) shifted by H relative to an output signal OUTn generated by the n-th stage of shift register GOAn, as shown in FIG. 3A. It may be seen that in the first mode, the gate driving circuit may scan the sub-pixels row by row (that is, sequentially turn on each row of the sub-pixels), so that the full-resolution display may be realized.

In the second mode, as shown in FIG. 3B, the k-th clock signal is synchronized with the (k+1)-th clock signal and the k-th clock signal is shifted by 2H relative to the (k+2)-th clock signal. For example, the clock signal CLK1 (the first clock signal) is synchronized with the clock signal CLK2 (the second clock signal), the clock signal CLK3 (the third clock signal) is synchronized with the clock signal CLK4 (the fourth clock signal), and the clock signal CLK3 (the third clock signal) is shifted by 2H relative to the clock signal CLK1 (the third clock signal), etc. Taking the gate driving circuit of FIG. 2 as an example, according to the working principle of the shift register described above, this setting for the clock signals CLK1 to CLK10 may make the output signal generated by the n-th stage of shift register synchronize with the output signal generated by the (n+1)-th stage of shift register, and the output signal generated by the n-th stage of shift register is shifted by 2H relative to the output signal generated by the (n+2)-th stage of shift register. It may be seen that in the second mode, the gate driving circuit may scan the sub-pixels two rows by two rows (that is, two rows of the sub-pixels are turned on at a time), so that a halved-resolution display may be realized.

In practice, if the gate driving circuit shown in FIG. 2 is driven in this manned, then there will be trailing in output signals of odd-numbered stages of shift registers, while there will be no trailing in output signals of even-numbered stages of shift registers. This will be described in detail below with reference to FIG. 4.

Figure 4:
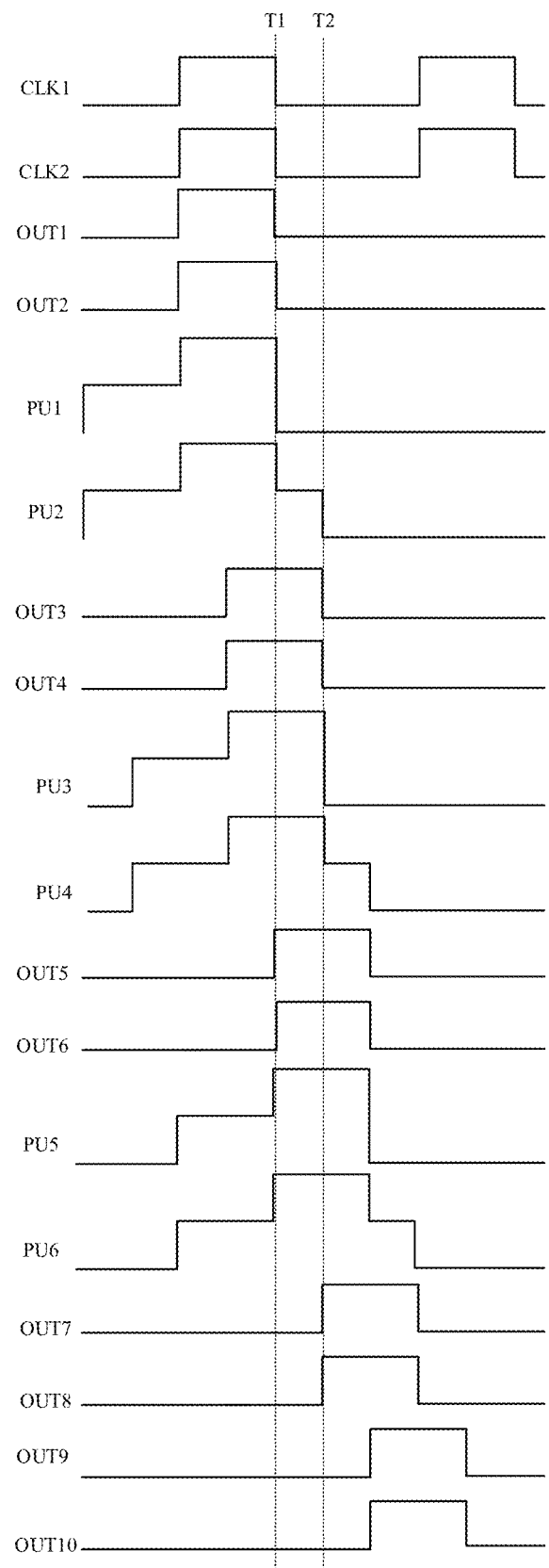
FIG. 4 shows a working principle diagram of the gate driving circuit in FIG. 2 in the second mode.

FIG. 4 shows a working principle diagram of the gate driving circuit in FIG. 2 in the second mode.

At time instant T1, the clock signals CLK1 and CLK2 both become low levels, so that the output signal OUT1 of the first stage of shift register GOA1 and the output signal of the second stage of shift register GOA2 both become low levels. Since the reset signal terminal of the first stage of shift register GOA1 is coupled to the output signal terminal of the sixth stage of shift register GOA6, the output signal OUT6 of the sixth stage of shift register GOA6 reset the pull-up node PU1 of the first stage of shift register GOA1 to a low level.

At time instant T2, since the reset signal terminal of the second stage of shift register GOA2 is coupled to the output signal terminal of the seventh stage of shift register GOA7, the output signal OUT7 of the seventh stage of shift register GOA7 resets the pull-up node PU2 of the second stage of shift register GOA2 to a low level.

It may be seen that for the first stage of shift register GOA1, the clock signal CLK1 of the clock signal terminal CLK and the reset signal (i.e. OUT6) of the reset signal terminal RST jump simultaneously at time instant T1 (CLK1 changes from the high level to the low level, and OUT6 changes from the low level to the high level). This allows the pull-up node PU and the clock signal terminal CLK to turn to the low level at the same time. At this time instant, the transistor M3 is turned off, while the output signal terminal OUT has not been pulled down sufficiently by the clock signal terminal CLK yet. Therefore, there is trailing for the output signal OUT1 at the output signal terminal OUT.

The second stage of shift register GOA2 is reset by the output signal OUT7 of the seventh stage of shift register GOAT, so that the pull-up node PU2 is pulled down after the clock signal CLK2 of the clock signal terminal CLK becomes low level (that is, at time instant T2). This allows the transistor M3 to remain conductive until the output signal OUT2 of the output signal terminal OUT is pulled down sufficiently by the clock signal terminal CLK. Therefore, there is no trailing for the output signal OUT2 of the second stage of shift register GOA2.

For the same reason, there is trailing for the output signal OUT3 of the third stage of shift register GOA3, while there is no trailing for the output signal OUT4 of the fourth stage of shift register GOA4, etc.

Figure 5:
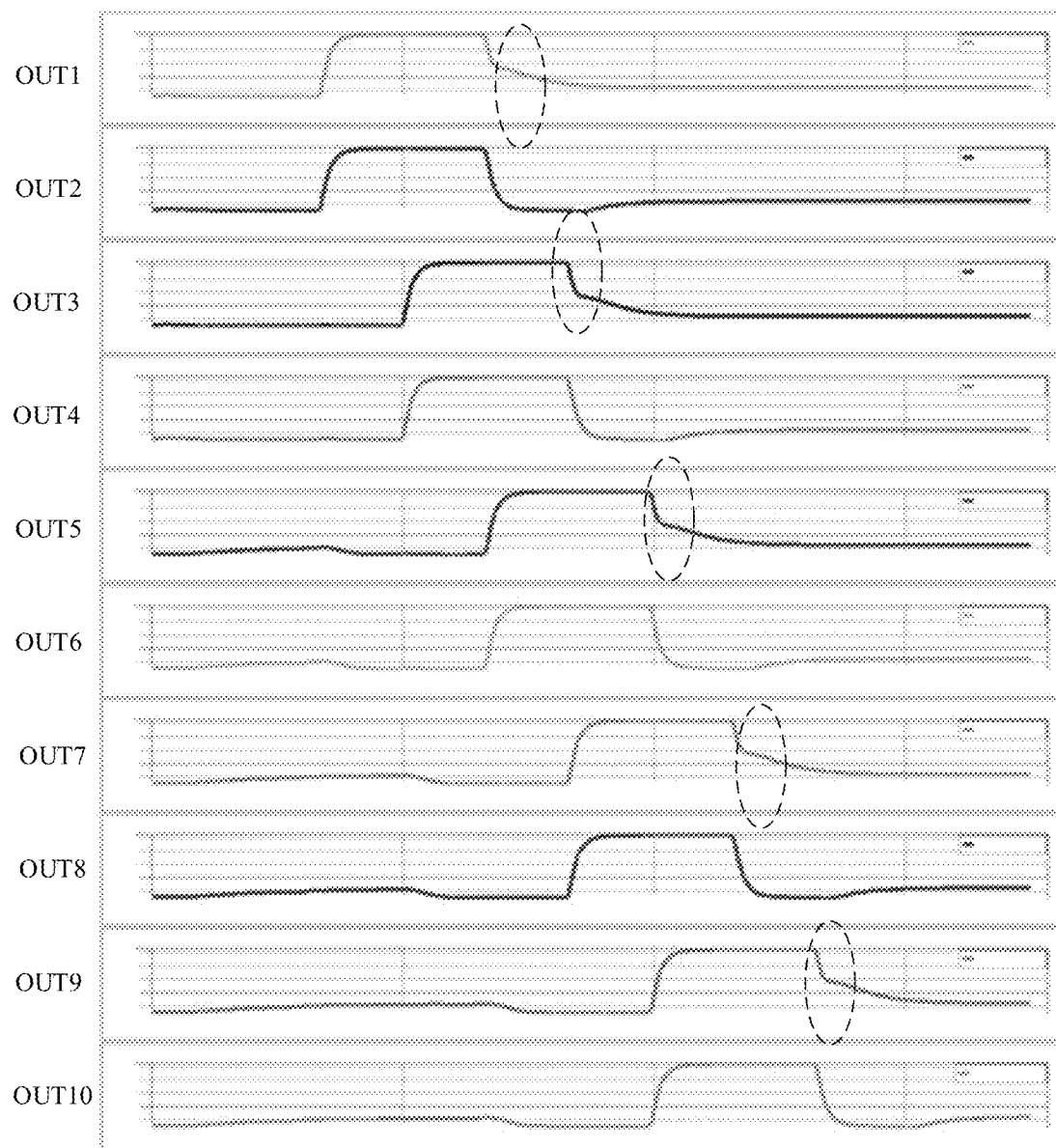
FIG. 5 shows a simulation diagram of an output signal of the gate driving circuit in FIG. 2 in the second mode.

FIG. 5 shows a simulation diagram of an output signal of the gate driving circuit in FIG. 2 in the second mode. It may be seen from FIG. 5 that due to the reason above, there is trailing (identified by the dashed box in FIG. 5) for the output signals OUT1, OUT3, OUT5 . . . of the odd-numbered stages of shift registers, while there is no trailing for the output signals OUT2, OUT4, OUT6 . . . of the even-numbered stages of shift registers relatively.

Figure 6A:
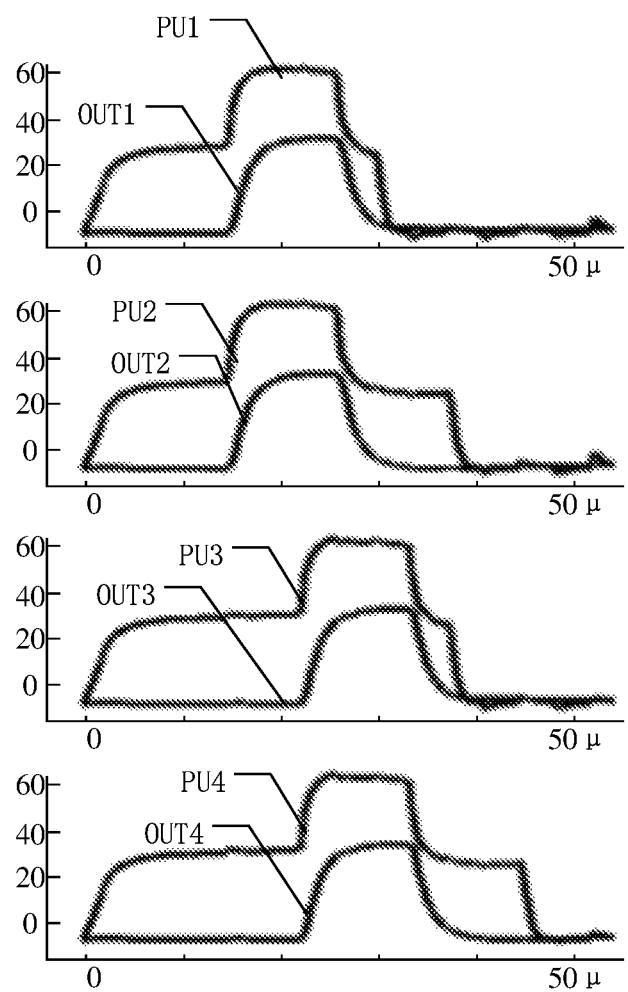
FIGS. 6A and 6B show signal simulation diagrams of the gate driving circuit in FIG. 2 at a refresh frequency of 60 Hz and 120 Hz respectively.
Figure 6B:
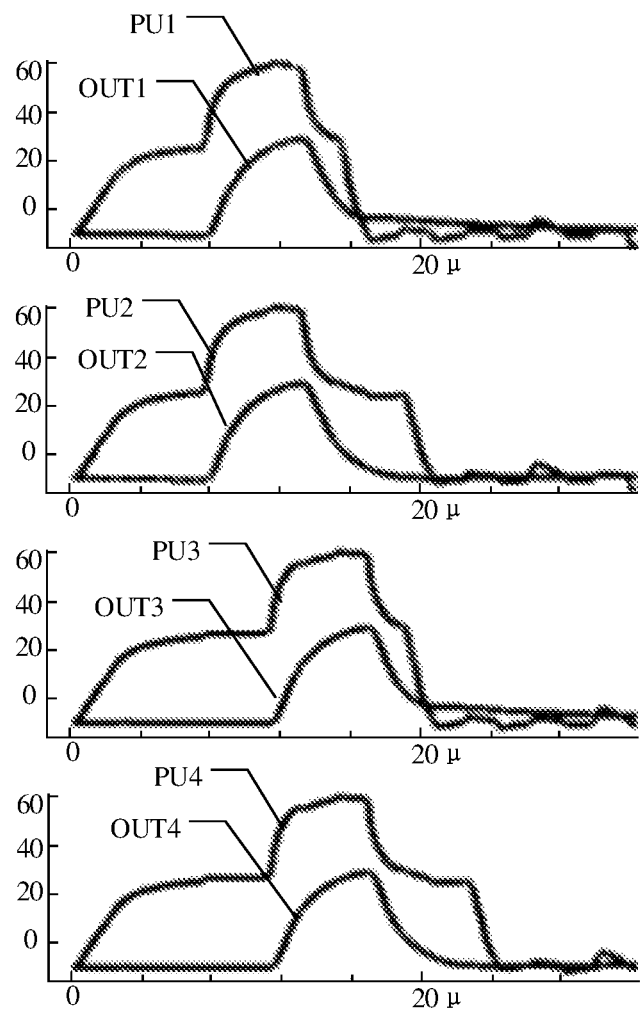

The trailing may be relieved by adjusting the duty cycle of the clock signals, for example, adjusting the duty cycle of the clock signals CLK1 to CLK10 from 40% to 30%. As shown in FIGS. 6A and 6B, by adjusting the duty cycle of the clock signals CLK1 to CLK10 to 30%, the pull-up nodes (such as PU1 and PU3) of the odd-numbered stages of shift registers are reset 1H later than corresponding output signals of the odd-numbered stages of shift registers, and the pull-up nodes (such as PU2 and PU4) of the even-numbered stages of shift registers are reset 3H later than corresponding output signals of the even-numbered stages of shift registers. Thus, the trailing of the output signals may be relieved to a certain extent. However, there are still differences between the reset time of the pull-up nodes of the odd-numbered stages of shift registers and the reset time of the pull-up nodes of the even-numbered stages of shift registers, such that waveforms of the output signals of the odd-numbered stages are still different from that of the even-numbered stages. This difference may become more visible especially when the refresh frequency is increased.

Figure 6C:
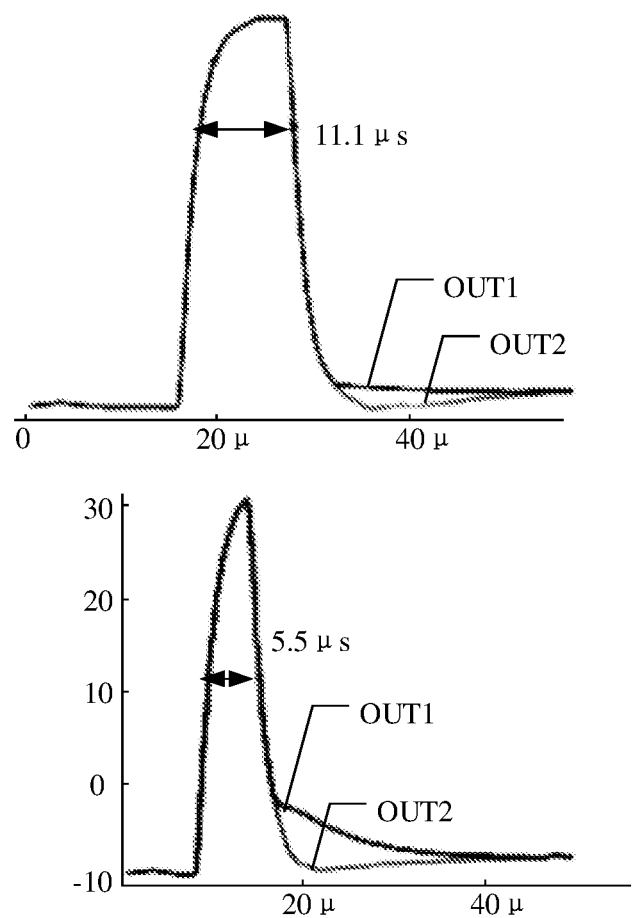
FIG. 6C shows comparison diagrams between an output signal of the gate driving circuit in FIG. 2 at the refresh frequency of 60 Hz and an output signal of the gate driving circuit in FIG. 2 at the refresh frequency of 120 Hz.

FIG. 6C shows comparison diagrams between an output signal of the gate driving circuit in FIG. 2 at the refresh frequency of 60 Hz and an output signal of the gate driving circuit in FIG. 2 at the refresh frequency of 120 Hz. It may be seen from FIG. 6C that at the refresh frequency of 60 Hz, a pulse width of the output signal is about 11.1 μs, and there is a difference between the potentials of the output signal (OUT1) of the odd-numbered stage and the output signal (OUT2) of the even-numbered stage when the potentials drop to about −7V. While when the refresh frequency is increased to 120 Hz, the unit scan time H is only about 1.85 us, and the pulse width of the output signal is about 5.55 μs. Even if the pull-up node is reset after the 1H delay, a discharge duration of the output signal is still too short. There is a visible difference between the potentials of the output signal (OUT1) of the odd-numbered stage and the output signal (OUT2) of the even-numbered stage when the potentials drop to about −1.3V. There is trailing for the output signal (OUT1) of the odd-numbered stage and there is a serial risk between output signals. Moreover, in the case of using 10 clock signals, the pulse width of the clock signals is 3H (about 5.55 μs). For an 8K resolution display panel, 432 groups of shift registers (10 shift registers in each group) are required. If the temperature is below a certain level, the last row of the shift registers has no output. Thus, there is a risk of failure in turning on at a low temperature.

According to the embodiments of the present disclosure, there is provided a gate driving circuit including 2N stages of shift registers including N first shift registers provided alternately with N second shift registers. The N first shift registers are cascaded-coupled as N stages, and are configured to generate N first output signals under control of K first clock signals. The N second shift registers are cascaded-coupled as N stages, and are configured to generate N second output signals under control of K second clock signals. K and N are both integers greater than 1, and K≤N. By alternately arranging N first shift registers and N second shift registers and cascading the N first shift registers and the N second shift registers independently from each other, some of the sub-pixels in the display area may be turned on and turned off independently. Therefore, a switching between different resolutions may be realized.

Figure 7A:
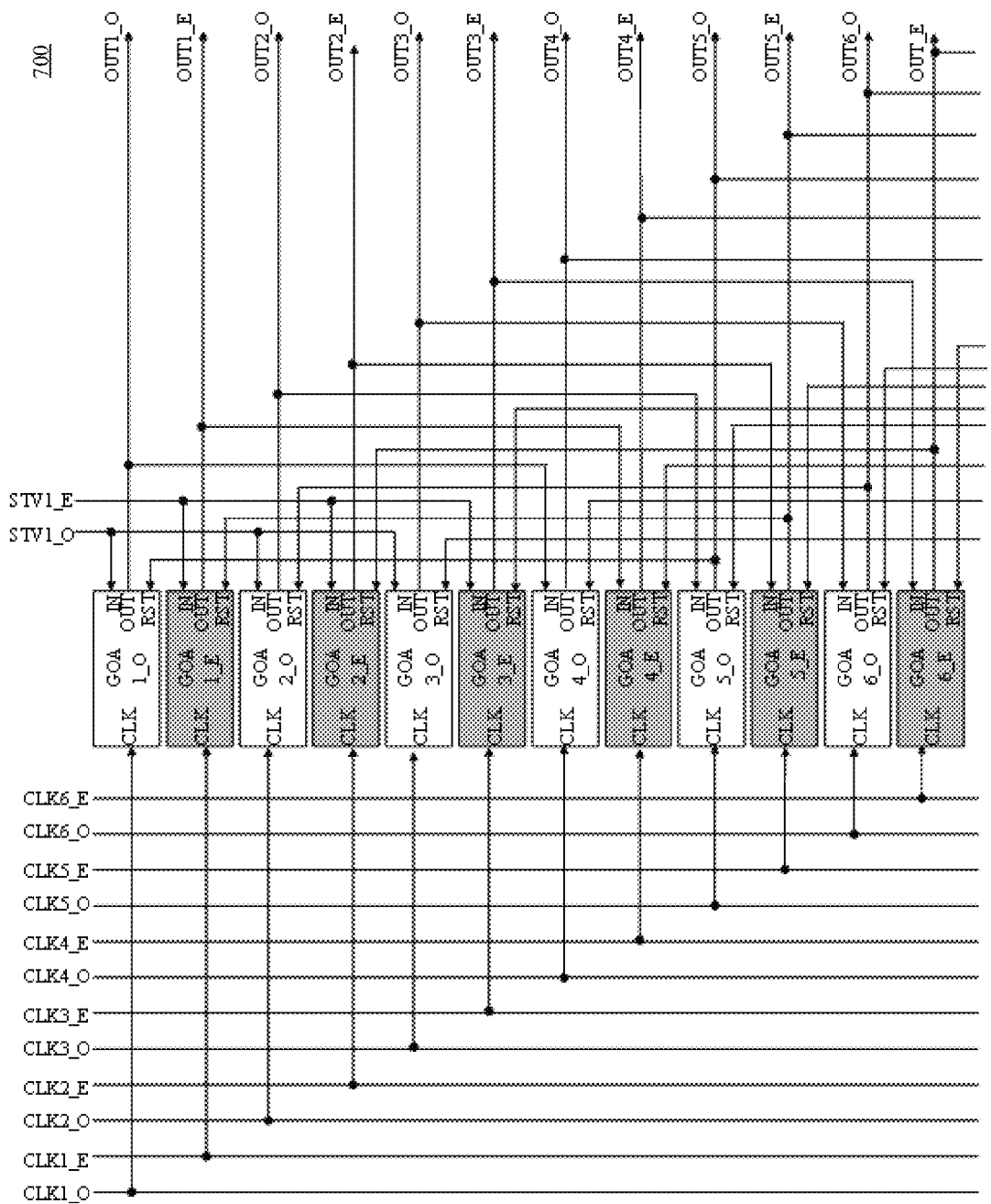
FIGS. 7A and 7B show structure diagrams of a gate driving circuit according to some embodiments of the present disclosure.
Figure 7B:
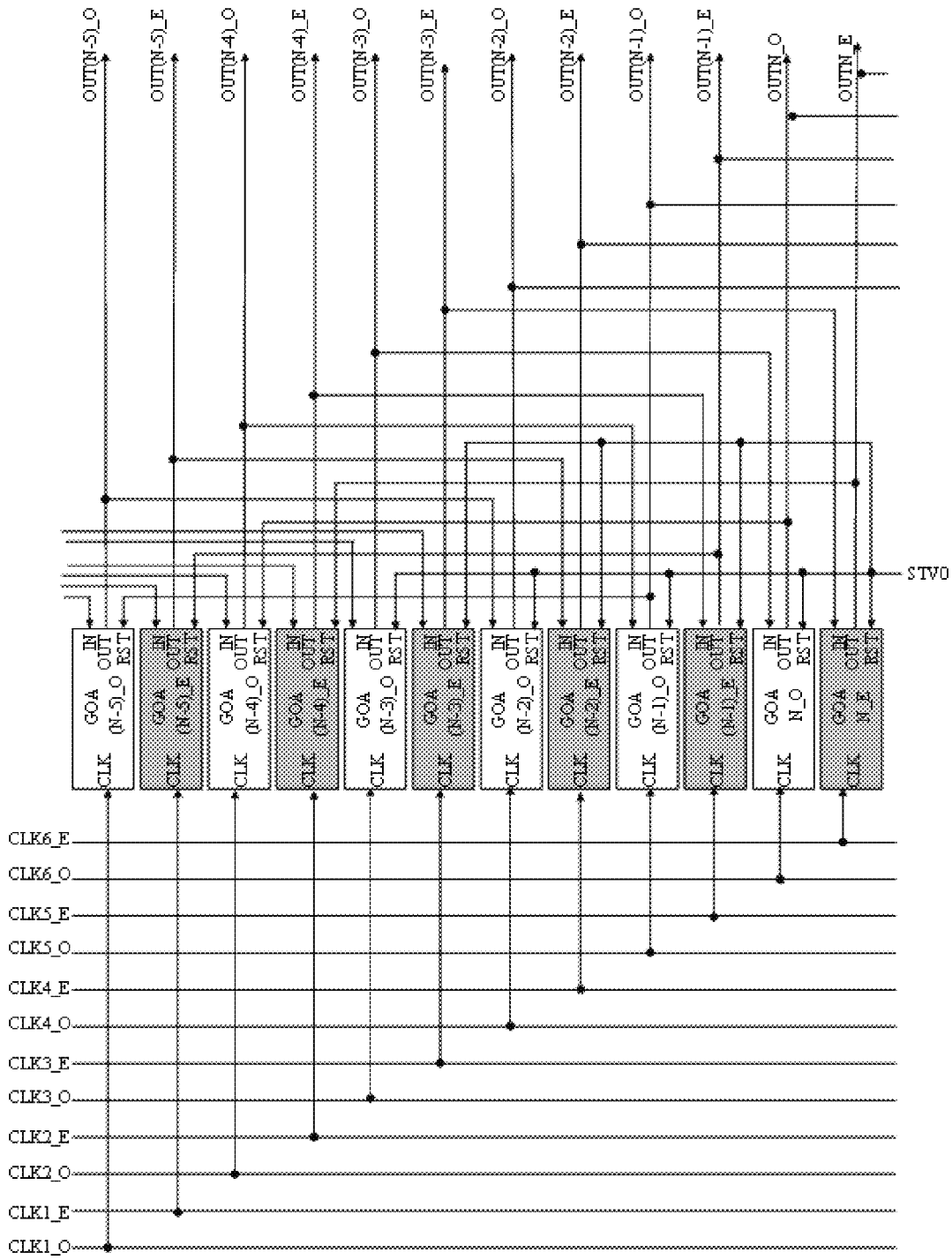

FIGS. 7A and 7B show structure diagrams of a gate driving circuit according to some embodiments of the present disclosure. For brevity, FIG. 7A shows the first 12 stages of shift registers of the gate driving circuit, and FIG. 7B shows the last 12 stages of shift registers of the gate driving circuit.

As shown in FIGS. 7A and 7B, the gate driving circuit 700 includes 2N stages of shift registers. The 2N stages of shift registers includes N first shift registers GOA1_O, GOA2_O, . . . GOAN_O provided alternately with N second shift registers GOA1_E, GOA2_E, . . . GOAN_E. For example, the first shift registers may be odd-numbered stages of shift registers, and the second registers may be even-numbered stages of shift registers. Each of the shift registers may include an input signal terminal IN, a pull-up node PU, a clock signal terminal CLK, and an output signal terminal OUT. For example, as described above with reference to FIG. 1A, each of the shift registers may provide a signal of the input signal terminal IN to the pull-up node PU. A signal of the clock signal terminal CLK may be provided to the output signal terminal OUT under control of a potential of the pull-up node PU, and the pull-up node PU may be reset under control of a signal of the reset signal terminal RST.

The gate driving circuit 700 is controlled by 2K clock signals, of which K clock signals are provided to the odd-numbered stages of shift registers, and K clock signals are provided to the even-numbered stages of shift registers. In FIGS. 7A and 7B, K=6, that is, the gate driving circuit 700 is controlled by 12 clock signals, of which 6 first clock signals CLK1_O, CLK2_O, . . . CLK6_O are provided to the first shift registers GOA1_O, GOA2_O, . . . GOAN_O respectively, 6 second clock signals CLK1_E, CLK2_E, . . . CLK6_E are provided to the second shift registers GOA1_E, GOA2_E, . . . GOAN_E respectively.

As shown in FIGS. 7A and 7B, the N first shift registers GOA1_O, GOA2_O, . . . GOAN_O may be divided into at least one group, and each of the at least one group includes 6 cascaded first shift registers. For example, in FIG. 7A, the first shift registers GOA1_O, GOA2_O, . . . GOA6_O are regarded as a group of first shift registers, to receive 6 first clock signals CLK1_O, CLK2_O, . . . CLK6_O respectively. For example, the clock signal terminal CLK of the first shift register GOA1_O receives the first clock signal CLK1_O, the clock signal terminal CLK of the first shift register GOA2_O receives the first clock signal CLK2_O, and the clock signal terminal CLK of the first shift register GOA3_O receives the first clock signal CLK3_O, etc. In this coupling manner, taking the first shift register GOA1_O as an example, the first shift register GOAL1_O may output, under control of a first clock signal CLK1_O received by the clock signal terminal CLK of the first shift register GOA1_O, a first output signal OUT1_O at the output signal terminal OUT of the first shift register GOA1_O based on a signal of the input signal terminal IN of the first shift register GOA1_O, and reset the pull-up node PU of the first shift register GOA1_O under control of a signal of the reset signal terminal RST of the first shift register GOA1_O. Other first shift registers work in a similar manner, and will not be repeated here.

In a similar manner, the N second shift registers GOA1_E, GOA2_E, . . . GOAN_E are divided into at least one group, and each of the at least one group includes 6 cascaded second shift registers. For example, in FIG. 7A, GOA1_E, GOA2_E, . . . GOA6_E are regarded as a group of second shift registers, to receive 6 second clock signals CLK1_E, CLK2_E, . . . CLK6_E respectively. For example, the clock signal terminal CLK of the second shift register GOA1_E receives the second clock signal CLK1_E, the clock signal terminal CLK of the second shift register GOA2_E receives the second clock signal CLK2_E, and the clock signal terminal CLK of the second shift register GOA3_E receives the second clock signal CLK3_E, etc. In this coupling mode, taking the second shift register GOA1_E as an example, the second shift register GOA1_E may output, under control of a second clock signal CLK1_E received by the clock signal terminal CLK of the second shift register GOA1_E, a second output signal OUT1_E at the output signal terminal OUT of the second shift register GOA1_E based on a signal of the input signal terminal IN of the second shift register GOA1_E, and reset the pull-up node PU of the second shift register GOA1_E under control of a signal of the reset signal terminal RST of the second shift register GOA1_E. Other second shift registers work in a similar manner, and will not be repeated here.

In the embodiments of the present disclosure, the N first shift registers are cascaded-coupled to obtain N stages of first shift registers. The N second shift registers are cascaded-coupled to obtain N stages of second shift registers. For example, an input signal terminal of the n-th stage of first shift register in the N stages of first shift registers is coupled to an output signal terminal of the (n−i)-th stage of first shift register in the N stages of first shift registers, and a reset signal terminal RST of the n-th stage of first shift register is coupled to an output signal terminal of the (n+j)-th stage of first shift register in the N stages of first shift registers. An input signal terminal of the n-th stage of second shift register in the N stages of second shift registers is coupled to an output signal terminal of the (n−i)-th stage of second shift register in the N stages of second shift registers, and a reset signal terminal of the n-th stage of second shift register is coupled to an output signal terminal of the (n+j)-th stage of second shift register in the N stages of second shift registers. n, i, and j are all integers greater than 0, K is an even number, $1<n<N$, $1\le i\le K/2$, and $K/2+1\le j\le K-1$.

In FIGS. 7A and 7B, i=3, and j=4. That is, the input signal terminal of the n-th stage of first shift register is coupled to the output signal terminal of the (n−3)-th stage of first shift register, and the reset signal terminal RST of the n-th stage of first shift register is coupled to the output signal terminal of the (n+4)-th stage of first shift register; and the input signal terminal of the n-th stage of second shift register is coupled to the output signal terminal of the (n−3)-th stage of second shift register, and the reset signal terminal of the n-th stage of second shift register is coupled to the output signal terminal of the (n+4)-th stage of second shift register.

As shown in FIG. 7A, the input signal terminals IN of the first to the third stages of first shift registers GOA1_O, GOA2_O, and GOA3_O are all configured to receive a first turn-on signal STV1_O. The input signal terminal IN of the fourth stage of first shift register GOA4_O is coupled to the output signal terminal OUT of the first stage of first shift register GOA1_O, and the input signal terminal IN of the fifth stage of first shift register GOA5_O is coupled to the output signal terminal OUT of the second stage of first shift register GOA2_O, etc. As shown in FIG. 7A, the reset signal terminal RST of the first stage of first shift register GOA1_O is coupled to the output signal terminal OUT of the fifth stage of first shift register GOA5_O, and the reset signal terminal RST of the second stage of first shift register GOA2_O is coupled to the output signal terminal OUT of the sixth stage of first shift register GOA6_O, etc.

In a similar manner, the input signal terminals IN of the first to the third stages of second shift registers GOA1_E, GOA2_E, and GOA3_E are all configured to receive a second turn-on signal STV1_E. The input signal terminal IN of the fourth stage of second shift register GOA4_E is coupled to the output signal terminal OUT of the second stage of second shift register GOA1_E, and the input signal terminal IN of the fifth stage of second shift register GOA5_E is coupled to the output signal terminal OUT of the second stage of second shift register GOA2_E, etc. As shown in FIG. 7A, the reset signal terminal RST of the second stage of second shift register GOA1_E is coupled to the output signal terminal OUT of the fifth stage of second shift register GOA5_E, and the reset signal terminal RST of the second stage of second shift register GOA2_E is coupled to the output signal terminal OUT of the sixth stage of second shift register GOA6_E, etc.

In some embodiments, reset signal terminals of the (N−j+1)-th to the N-th stages of first shift registers in the N stages of first shift registers and reset signal terminals of the (N−j+1)-th to the N-th stages of second shift registers in the N stages of second shift registers are configured to receive a total reset signal. As shown in FIG. 7B, reset signal terminals RST of the (N−3)-th to the N-th stages of first shift registers GOAN_O, GOA(N−1)_O, GOA(N−2)_O and GOA(N−3)_O and reset signal terminals RST of the (N−3)-th to the N-th stages of second shift registers GOAN_E, GOA(N−1)_E, GOA(N−2)_E and GOA(N−3)_E are all configured to receive a total reset signal STV0. However, the embodiments of the present disclosure are not limited thereto. In some embodiments, the first shift registers and the second shift registers may be coupled to different total reset signals. For example, reset signal terminals RST of the (N−3)-th to the N-th stages of first shift registers GOAN_O, GOA(N−1)_O, GOA(N−2)_O and GOA(N−3)_O may be coupled to a first total reset signal and reset signal terminals RST of the (N−3)-th to the N-th stages of second shift registers GOAN_E, GOA(N−1)_E, GOA(N−2)_E and GOA(N−3)_E may be coupled to a second total reset signal.

In some embodiments, the first shift register and the second shift register may further include a total reset terminal Total_RST, such as the structure described above with reference to FIG. 1C, and the total reset terminal Total_RST of each shift register may be configured to receive the total reset signal STV0. For example, in FIGS. 7A and 7B, each first shift register GOA1_O, GOA2_O, . . . GOAN_O may reset the pull-up node PU of said each first shift register under control of a signal of a total reset terminal of said each first shift register. Each second shift register GOA1_E, GOA2_E, . . . GOAN_E may reset the pull-up node PU of said second shift register under control of a signal of a total reset terminal of said second shift register. The total reset terminals of the N first shift registers GOA1_O, GOA2_O, . . . GOAN_O and the total reset terminals of the N second shift registers GOA1_E, GOA2_E, . . . GOAN_E may all be configured to receive the total reset signal STV0.

Figure 8:
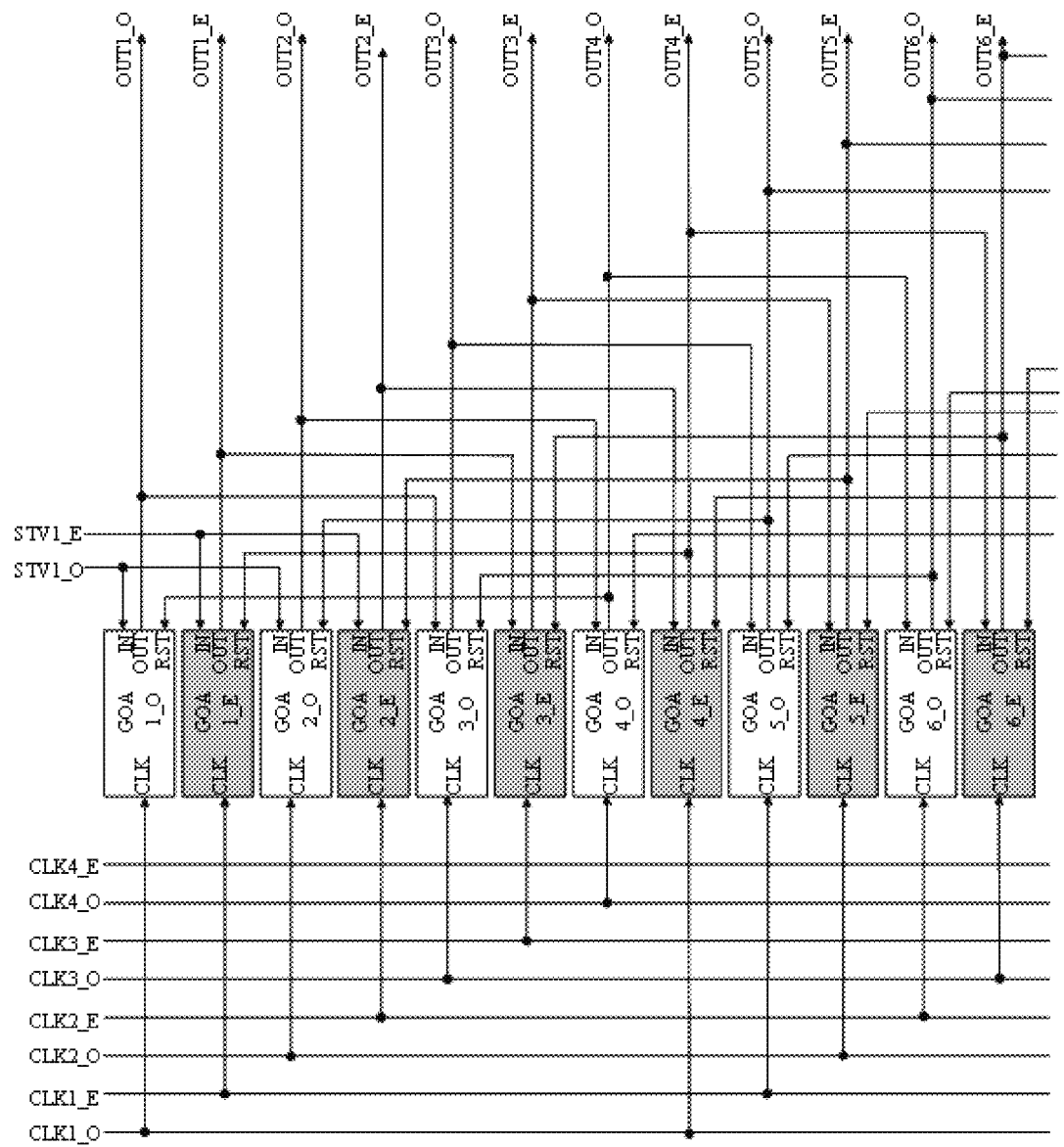
FIG. 8 shows a structure diagram of a gate driving circuit according to some embodiments of the present disclosure.

FIG. 8 shows a structure diagram of a gate driving circuit according to some embodiments of the present disclosure. The gate driving circuit 800 of FIG. 8 is similar to the gate driving circuit 700 of FIGS. 7A and 7B, and at least the difference is that K=4, i=2, and j=3. For brevity, the differences may be described in detail below.

As shown in FIG. 8, the gate driving circuit 800 includes 2N shift registers controlled by 2K=8 clock signals, in which every 8 shift registers are used as a group to receive the 8 clock signals. For example, the first group of shift registers GOA1_O, GOA1_E, GOA2_O, GOA2_E, GOA3_O, GOA3_E, GOA4_O, GOA4_E are sequentially configured to receive the clock signals CLK1_O, CLK1_E, CLK2_O, CLK2_E, CLK3_O, CLK3_E, CLK4_O, CLK4_E. The second group of shift registers GOA5_O, GOA5_E, GOA6_O, GOA6_E, GOA7_O, GOA7_E, GOA8_O, GOA8_E are coupled in the same way to receive clock signals CLK1_O, CLK2_O, CLK2_E, CLK3_O, CLK3_E, CLK4_O, CLK4_E, etc.

In the gate driving circuit 800, the input signal terminal IN of the n-th stage of first shift register GOAn_O is coupled to the output signal terminal OUT of the (n−2)-th stage of first shift register GOA(n−2)_O, and the reset signal terminal RST of the n-th stage of first shift register GOAn_O is coupled to the output signal terminal OUT of the (n+3)-th stage of first shift register GOA(n+3)_O. In a similar manner, the input signal terminal IN of the n-th stage of second shift register GOAn_E is coupled to the output signal terminal OUT of the (n−2)-th stage of second shift register GOA(n−2)_E, and the reset signal terminal RST of the n-th stage of second shift register GOAn_E is coupled to the output signal terminal OUT of the (n+3)-th stage of second shift register GOA(n+3)_E.

In the gate driving circuit 800, the input signal terminals IN of the first and the second stages of first shift registers GOA1_O and GOA2_O are both configured to receive a first turn-on signal STV1_O. The input signal terminals IN of the first and the second stages of second shift registers GOA1_E and GOA2_E are both configured to receive a second turn-on signal STYLE. Reset signal terminals RST of the (N−2)-th to the N-th stages of first shift registers GOAN_O, GOA(N−1)_O and GOA(N−2)_O and reset signal terminals RST of the (N−2)-th to the N-th stages of second shift registers GOAN_E, GOA(N−1)_E and GOA(N−2)_E are all configured to receive the total reset signal STV0. However, the embodiments of the present disclosure are not limited thereto. In some embodiments, the first shift register and the second shift register may be coupled to different total reset signals, respectively. In some embodiments, the first shift register and the second shift register may further include a total reset terminal Total_RST, such as the structure described above with reference to FIG. 1C, and the total reset terminal Total_RST of each shift register may be configured to receive the total reset signal STV0.

Figure 9:
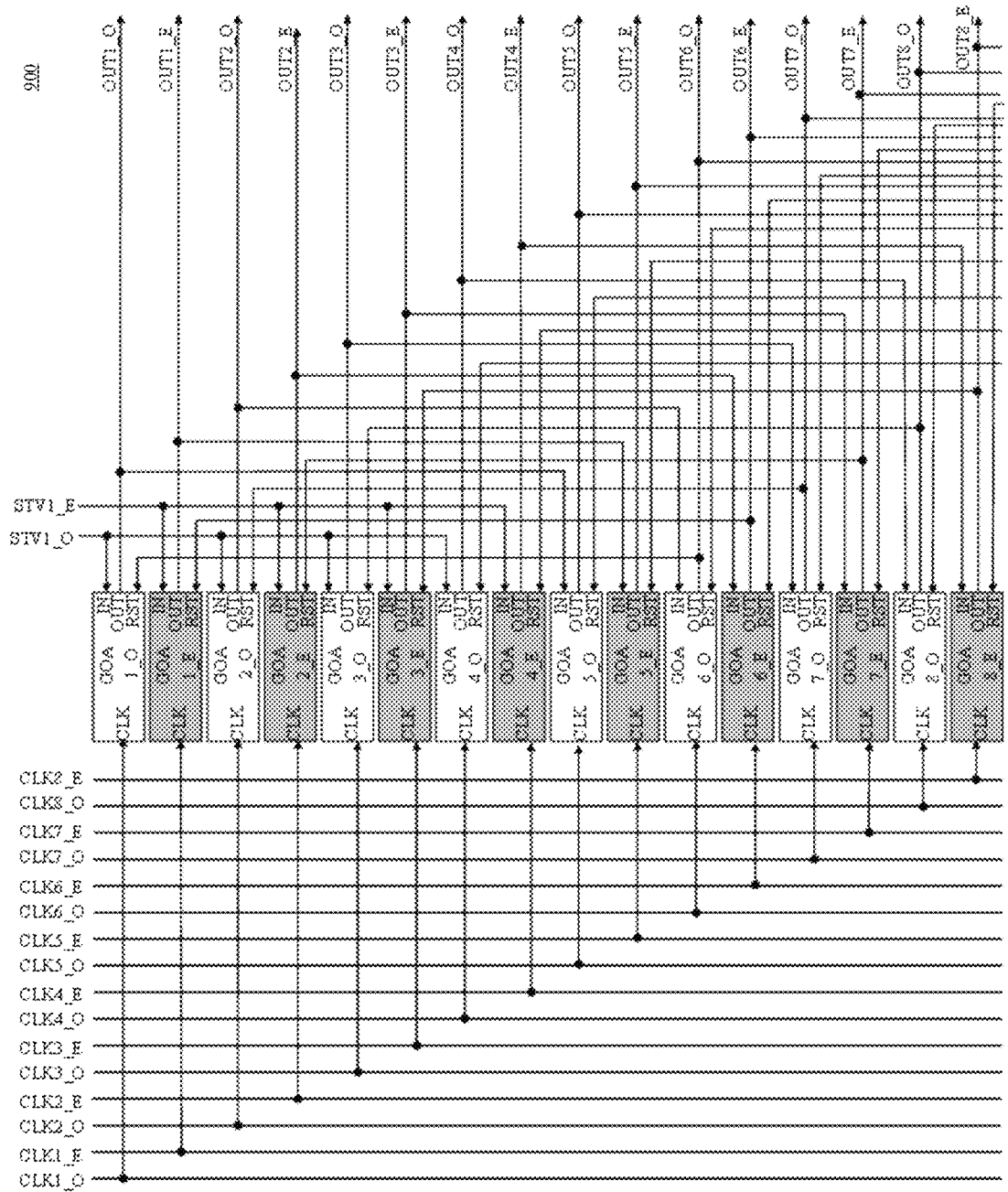
FIG. 9 shows a structure diagram of a gate driving circuit according to some embodiments of the present disclosure.

FIG. 9 shows a structure diagram of a gate driving circuit according to some embodiments of the present disclosure. The gate driving circuit 900 of FIG. 9 is similar to the gate driving circuit 700 of FIGS. 7A and 7B, and at least the difference is that K=8, i=4, and j=5. For brevity, the differences may be described in detail below.

As shown in FIG. 9, the gate driving circuit 900 includes 2N shift registers controlled by 2K=16 clock signals, in which every 16 shift registers are used as a group to receive the 16 clock signals. For example, the first group of 16 shift registers GOAL1_O to GOA6_E are sequentially configured to receive the clock signals CLK1_O to CLK8_E. The second group of 16 shift registers GOA9_O to GOA16_E are coupled in the same way to receive clock signals CLK1_O to CLK8_E, etc.

In the gate driving circuit 900, the input signal terminal IN of the n-th stage of first shift register GOAn_O is coupled to the output signal terminal OUT of the (n−4)-th stage of first shift register GOA(n−4)_O, and the reset signal terminal RST of the n-th stage of first shift register GOAn_O is coupled to the output signal terminal OUT of the (n+5)-th stage of first shift register GOA(n+5)_O. In a similar manner, the input signal terminal IN of the n-th stage of second shift register GOAn_E is coupled to the output signal terminal OUT of the (n−4)-th stage of second shift register GOA(n−4)_E, and the reset signal terminal RST of the n-th stage of second shift register GOAn_E is coupled to the output signal terminal OUT of the (n+5)-th stage of second shift register GOA(n+5)_E.

In the gate driving circuit 900, the input signal terminals IN of the first to the fourth stages of first shift registers GOA1_O, GOA2_O, GOA3_O and GOA4_O are all configured to receive the first turn-on signal STV1_O. The input signal terminals IN of the first to the fourth stages of second shift registers GOA1_E, GOA2_E, GOA3_E and GOA4_E are all configured to receive the second turn-on signal STV1_E. Reset signal terminals RST of the (N−4)-th to the N-th stages of first shift registers GOAN_O, GOA(N−1)_O, GOA(N−2)_O, GOA(N−3)_O and GOA(N−4)_O and reset signal terminals RST of the (N−4)-th to the N-th stages of second shift registers GOAN_E, GOA(N−1)_E, GOA(N−2)_E, GOA(N−3)_E and GOA(N−4)_E are all configured to receive the total reset signal STV0. However, the embodiments of the present disclosure are not limited thereto. In some embodiments, the first shift register and the second shift register may be coupled to different total reset signals, respectively. In some embodiments, the first shift register and the second shift register may further include a total reset terminal Total_RST, such as the structure described above with reference to FIG. 1C, and the total reset terminal Total_RST of each shift register may be configured to receive the total reset signal STV0.

According to the embodiments of the present disclosure, there is further provided a method of driving the above-mentioned gate driving circuit. By turning on and turning off the first shift register and the second shift register independently, switching of a plurality of display modes may be realized.

FIG. 10 shows a flowchart of a method of driving a gate driving circuit according to some embodiments of the present disclosure. This method is applicable to the gate driving circuit of any of the above embodiments, such as the gate driving circuit described above with reference to FIG. 7A to FIG. 9.

In operation S1001, the 2N stages of shift registers are turned on in a first mode, so that the N first shift registers of the 2N stages of shift registers generate the N first output signals under control of the K first clock signals; and the N second shift registers of the 2N stages of shift registers generate the N second output signals under control of the K second clock signals.

In operation S1002, the N first shift registers are turned on in a second mode, so that the N first shift registers generate the N first output signals under control of the K first clock signals, and the N first output signals are shifted sequentially, or the N second shift registers are turned on in the second mode, so that the N second shift registers generate the N second output signals under control of the K second clock signals, and the N second output signals are shifted sequentially.

Hereinafter, signal timing of the gate driving circuit will be described with reference to FIGS. 11A, 11B, 12A, and 12B in combination with the gate driving circuit 700 described above with reference to FIGS. 7A and 7B.

Figure 11A:
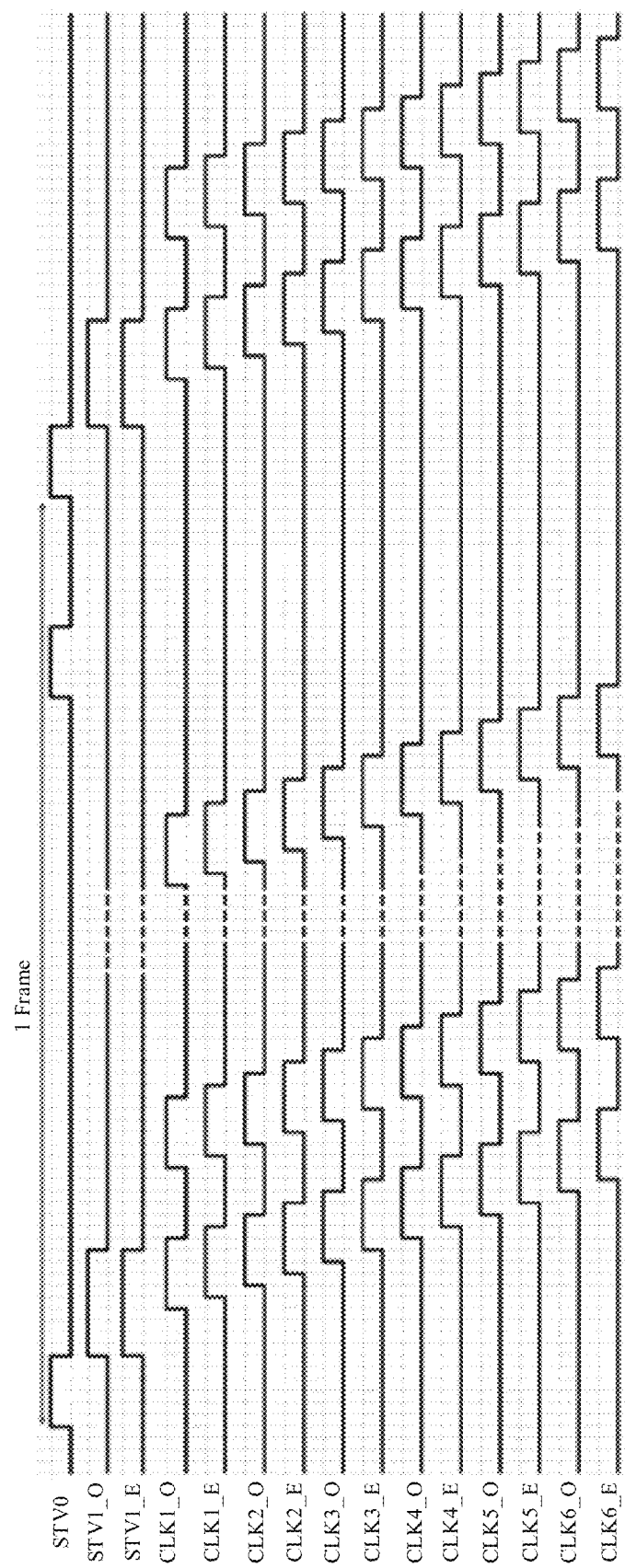
FIG. 11A shows a signal timing diagram of a gate driving circuit in the first mode according to some embodiments of the present disclosure.

FIG. 11A shows a signal timing diagram of a gate driving circuit in the first mode according to some embodiments of the present disclosure.

As shown in FIG. 11A, in the first mode, at a beginning of a frame, the total reset signal STV0 is applied to the gate driving circuit 700 to reset all the 2N stages of shift registers.

After the resetting, the first turn-on signal STV1_0 is applied to the first two odd-numbered stages GOA1_O and GOA2_O (located in the first and third stages of the 2N stages respectively) of the N odd-numbered stages of shift registers in the gate driving circuit 700. The second turn-on signal ST1_LE is applied to the first two even-numbered stages GOA1_E and GOA2_E (located in the second and fourth stages of the 2N stages respectively) of the even-numbered stages of shift registers in the gate driving circuit 700. The shift registers GOA1_O and GOA2_O are turned on in response to the high level of the first turn-on signal STV1_O, and the shift registers GOA1_E and GOA2_E are turned on in response to the high level of the second turn-on signal STV1_E.

After the turning on, the shift register GOA1_O generates the output signal OUT1_O according to the received clock signal CLK1_O, the shift register GOA1_E generates the output signal OUT1_E according to the received clock signal CLK1_E, the shift register GOA2_O generates the output signal OUT2_O according to the received clock signal CLK2_O, and the shift register GOA2_E generates the output signal OUT2_E according to the received clock signal CLK2_E. As shown in FIG. 11, the clock signals CLK1_O, CLK1_E, CLK2_O, and CLK2_E have the same signal waveforms and are shifted sequentially, so that the shift registers GOA1_O, GOA1_E, GOA2_O, and GOA2_E generate sequentially shifted output signals OUT1_O, OUT1_E, OUT 2_O, and OUT 2_E.

Next, the output signal OUT1_O is provided as an input signal to the shift register GOA4_O, so that GOA4_O generates the output signal OUT4_O according to the clock signal CLK4_O. In a similar manner, the output signal OUT1_E triggers the shift register GOA4_E to generate the output signal OUT4_E according to the clock signal CLK4_E, and the output signal OUT4_E is shifted relative to the output signal OUT4_O. In this way, 2N stages of output signals OUT1_O to OUTN_E are generated, which are sequentially shifted.

Figure 11B:
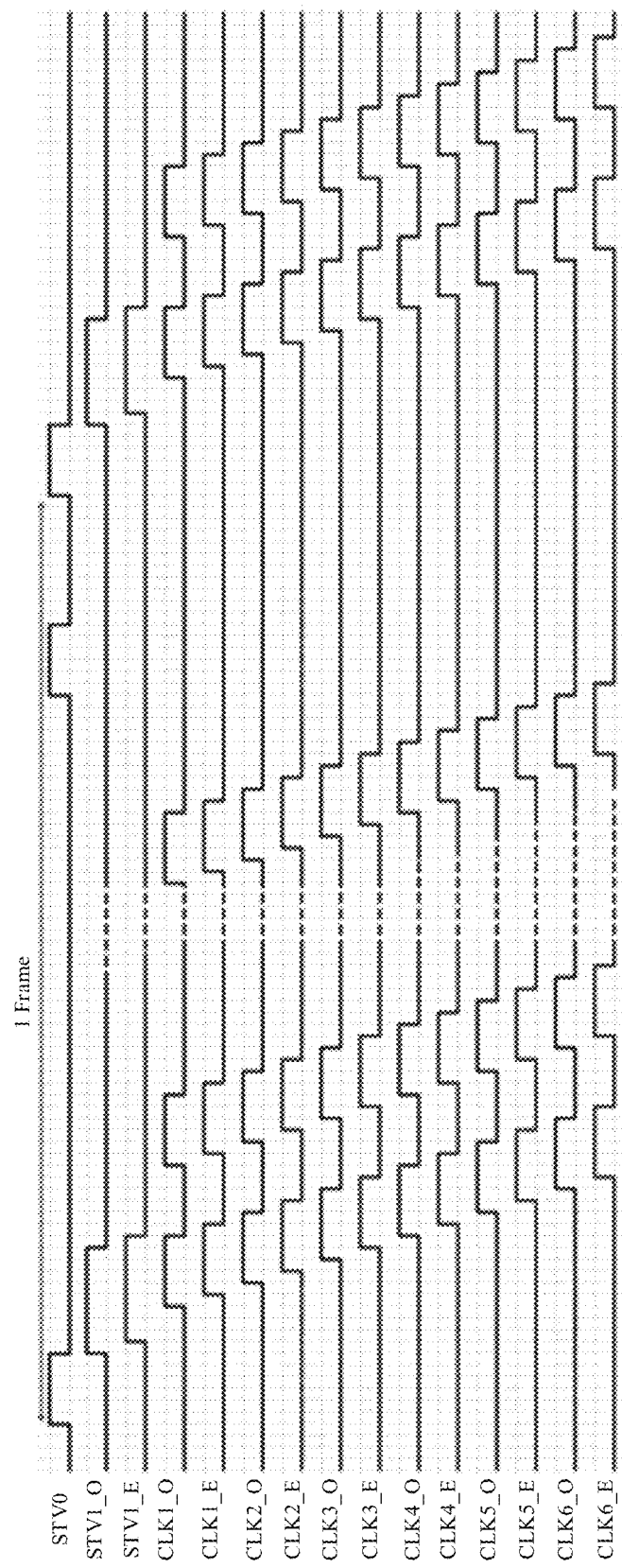
FIG. 11B shows a signal timing diagram of the gate driving circuit in the first mode according to some embodiments of the present disclosure.

In FIG. 11A, the first turn-on signal STV1_O and the second turn-on signal STV_E are synchronized, that is, the first shift register and the second shift register may be turned on at the same time. This may not affect the timing of the output signals because the output timing of the output signals is controlled by the clock signals. However, the embodiments of the present disclosure are not limited thereto. In some embodiments, as shown in FIG. 11B, the second turn-on signal STYLE may be shifted relative to the first turn-on signal STV1_O, and a value of the shift may be equal to a shift between adjacent clock signals. That is, the first shift register is turned on first, and the second shift register is turned on later. Effective level durations of the first turn-on signal STV1_O and the second turn-on signal STV_E may be greater than a high level duration in a unit period of the clock signal, so that the pull-up nodes of the first four stages of shift registers may have sufficient time to charge to desired potentials.

Figure 12A:
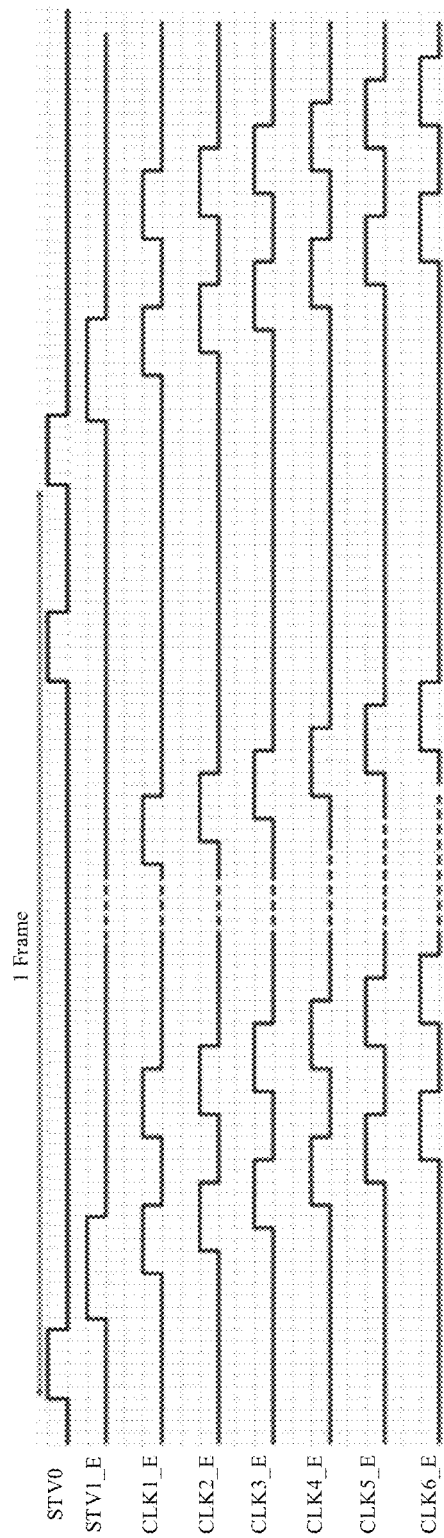
FIGS. 12A and 12B show signal timing diagrams of the gate driving circuit in the second mode according to some embodiments of the present disclosure.
Figure 12B:
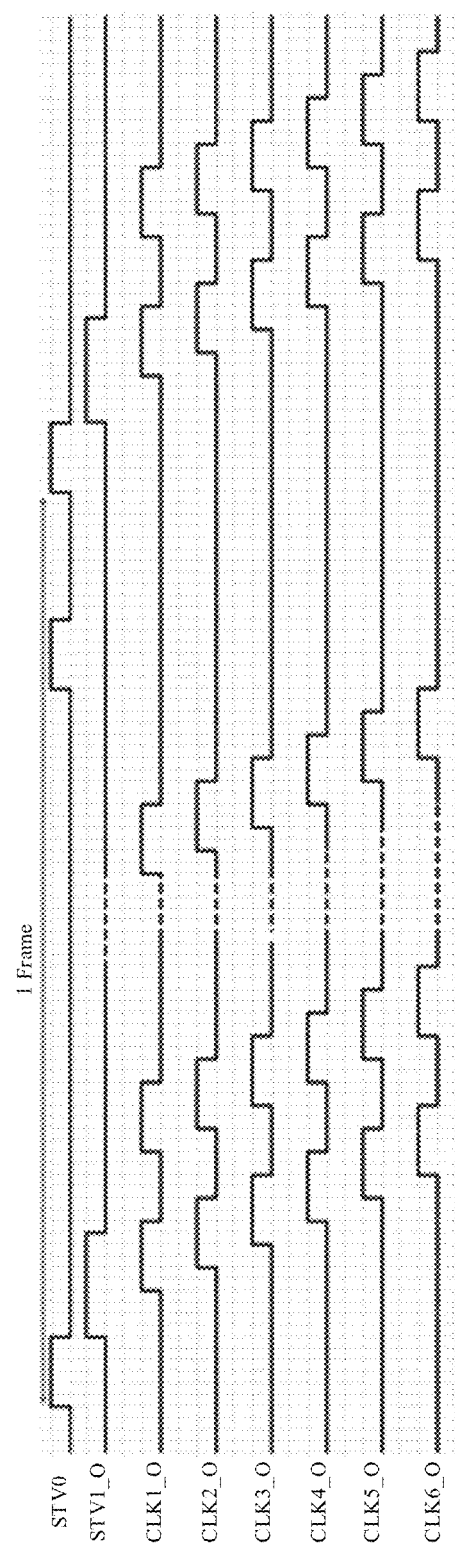

FIGS. 12A and 12B show signal timing diagrams of the gate driving circuit in the second mode according to some embodiments of the present disclosure. In the second mode, it is possible to determine whether to turn on the N odd-numbered stages of shift registers or turn on the N even-numbered stages of shift registers first. When turning on the odd-numbered stages of shift registers, the signal timing shown in FIG. 12A is used for driving. When turning on the even-numbered stages of shift registers, the signal timing shown in FIG. 12B is used for driving.

As shown in FIG. 12A, after the gate driving circuit 700 is totally reset using the total reset signal STV0, the first turn-on signal STV1_O at a high level is applied to the first two odd-numbered stages GOA1_O and GOA2_O of the N odd-numbered stages of shift registers in the gate driving circuit 700. The shift registers GOA1_O and GOA2_O are turned on in response to the high level of the first turn-on signal STV1_0, thereby triggering a shift registering operation. Thus, the N odd-numbered stages of shift registers generate N sequentially shifted output signals OUT1_O, OUT2_O, . . . OUTN_O. During this period, the second turn-on signal STV_E is always at a low level, and the even-numbered stages of shift registers may not generate output signals. In this way, the odd-numbered rows of sub-pixels in the display area may be turned on, and the even-numbered rows of sub-pixels may be turned off, thereby realizing the low-resolution display. For example, for the 8K resolution display panel, a 4K resolution display or lower resolution display may be realized by turning off half of the sub-pixels.

As shown in FIG. 12B, similar to FIG. 12A, the second turn-on signal STV1_E at a high level is applied to the first two even-numbered stages GOA1_E and GOA2_E of the N even-numbered stages of shift registers in the gate driving circuit 700. The shift registers GOA1_E and GOA2_E are turned on in response to the high level of the second turn-on signal STYLE, thereby triggering the shift registering operation. Thus, the N even-numbered stages of shift registers generate N sequentially shifted output signals OUT1_E, OUT2_E, . . . OUTN_E. During this period, the first turn-on signal STV_O is always at a low level, and the odd-numbered stages of shift registers may not generate output signals. In this way, the even-numbered rows of sub-pixels in the display area may be turned on, and the odd-numbered rows of sub-pixels may be turned off, thereby realizing the low-resolution display.

It is possible to keep applying corresponding clock signals to the shift registers that are not turned on. Alternatively, it is further possible to stop applying the corresponding clock signals to the shift registers that are not turned on. For example, during a period when the first shift register is turned on and the second shift register is turned off, it is possible to keep applying the second clock signals CLK1_E to CLK6_E shown in FIG. 11 to the second shift registers, or it is possible to apply no clock signal to the second shift registers.

Although the first shift registers and the second shift registers are described by taking the odd-numbered stages of shift registers and the even-numbered stages of shift registers as examples in the embodiments above, the embodiments of the present disclosure are not limited thereto. The first shift registers and the second shift registers may be alternately provided in other ways. For example, two second shift registers may be provided every two first shift registers. In some embodiments, a plurality of third shift registers cascaded may further be provided. The first, fourth, seventh . . . stages of shift registers may be regarded as the first shift registers, the second, fifth, eighth . . . stages of shift registers may be regarded as the second shift registers, and the third, sixth, ninth . . . stages of shift registers may be regarded as the third shift registers. Three turn-on signals may be used to turn on the first, second, and third shift registers respectively, so as to realize independent controls of the first shift registers, the second shift registers and the third shift registers.

Although the structures of the shift registers in FIG. 1A and FIG. 1C are taken as examples in the embodiments above to describe the gate driving circuit and the driving method thereof, the embodiments of the present disclosure are not limited thereto. The gate driving circuit of the embodiments of the present disclosure may adopt any suitable structure as required.

FIG. 13 schematically shows a block diagram of a display device according to some embodiments of the present disclosure. As shown in FIG. 13, the display panel 1300 includes a gate driving circuit 1301. The gate driving circuit 1301 may be implemented by the gate driving circuit of any of the embodiments above, such as one of the gate driving circuits 700, 800 or 900. The display panel 1300 may have an 8K resolution. For example, sub-pixels of a display area of the display panel 1300 are provided in a 7680×4320 array. When the refresh frequency is 60 Hz, H=1/60÷4320≈3.7 μs. When the refresh frequency is 120 Hz, H is about 1.85 μs.

Those skilled in the art may understand that the embodiments described above are all exemplary, and may be improved by those skilled in the art. The structures described in the various embodiments may be combined without conflicts in structure or principle.

After describing the optional embodiments of the present disclosure in detail, those skilled in the art may clearly understand that various variations and changes may be made without departing from the scope and spirit of the appended claims, and the present disclosure is not limited to the implementation of the exemplary embodiments cited in the specification.

We claim:

1. A gate driving circuit comprising 2×N stages of shift registers, the 2×N stages of shift registers comprising N first shift registers arranged alternately with N second shift registers, wherein the N first shift registers are cascaded-coupled as N stages of first shift registers, and are configured to generate N first output signals under control of K first clock signals; and wherein the N second shift registers are cascaded-coupled as N stages of second shift registers, and are configured to generate N second output signals under a control of K second clock signals, wherein K and N are both integers greater than 1, and K≤N;

wherein an input signal terminal if an n-th stage if first shift register in the N stages of first shift registers is coupled to an output signal terminal of an (n−i)-th stage of first shift register in the N stages of first shift registers, and a reset signal terminal of the n-th stage of first shift register is coupled to an output signal terminal of an (n+j)-th stage of first shift register in the N stages of first shift registers, and wherein an input signal terminal of an n-th stage of second shift register in the N stages of second shift registers is coupled to an output signal terminal of an (n−i)th stage of second shift register in the N stages of second shift registers, and a reset signal terminal of the n-th stage of second shift register is coupled to an output signal terminal of an (n+j)-th stage of second shift register in the N stages if second shift registers, wherein n, i, and j are all integers greater than 0, K is an even number, 1<n<N, 1≤i≤K/2, and K/2+1≤j≤K−1.

2. The gate driving circuit of claim 1, wherein K=6, i=3, and j=4.

3. The gate driving circuit of claim 1, wherein K=4, i=2, and j=3.

4. The gate driving circuit of claim 1, wherein K=8, i=4, and j=5.

5. The gate driving circuit of claim 1,
wherein input signal terminals of first to i-th stages of first shift registers in the N stages of first shift registers are configured to receive a first turn-on signal; and
wherein input signal terminals of first to i-th stages of second shift registers in the N stages of second shift registers are configured to receive a second turn-on signal.

6. The gate driving circuit of claim 1, wherein reset signal terminals of (N−j+1)-th to N-th stages of first shift registers in the N stages of first shift registers and reset signal terminals of (N−j+1)-th to N-th stages of second shift registers in the N stages of second shift registers are configured to receive a total reset signal.

7. The gate driving circuit of claim 1, wherein the first shift registers are odd-numbered stages of shift registers in the 2×N stages of shift registers, and the second shift registers are even-numbered stages of shift registers in the 2×N stages of shift registers.

8. The gate driving circuit of claim 2, wherein the first shift registers are odd-numbered stages of shift registers in the 2×N stages of shift registers, and the second shift registers are even-numbered stages of shift registers in the 2×N stages of shift registers.

9. The gate driving circuit of claim 1,
wherein the N first shift registers are divided into at least one group of K cascaded first shift registers, and clock signal terminals of the K cascaded first shift registers are configured to receive the K first clock signals respectively; and
wherein the N second shift registers are divided into at least one group of K cascaded second shift registers, and clock signal terminals of the K cascaded second shift registers are configured to receive the K second clock signals respectively.

10. The gate driving circuit of claim 1,
wherein each of the first shift registers is configured to output a first output signal at an output signal terminal of said each of the first shift registers based on a signal of an input signal terminal of said each of the first shift registers under control of a first clock signal received by a clock signal terminal of said each of the first shift registers, and reset a pull-up node of said each of the first shift registers under control of a signal of a reset signal terminal of said each of the first shift registers; and
wherein each of the second shift registers is configured to output a second output signal at an output signal terminal of said each of the second shift registers based on a signal of an input signal terminal of said each of the second shift registers under control of a second clock signal received by a clock signal terminal of said each of the second shift registers, and reset a pull-up node of said each of the second shift registers under control of a signal of a reset signal terminal of said each of the first shift registers.

11. The gate driving circuit of claim 1,
wherein each of the first shift registers is further configured to reset a pull-up node of said each of the first shift registers under control of a signal of a total reset terminal of said each of the first shift registers; and
wherein each of the second shift registers is further configured to reset a pull-up node of said each of the second shift registers under control of a signal of a total reset terminal of said each of the second shift registers,
wherein total reset terminals of the N first shift registers and total reset terminals of the N second shift registers are configured to receive a total reset signal.

12. A display panel comprising a gate driving circuit, wherein the gate driving circuit comprising 2×N stages of shift registers, the 2×N stages of shift registers comprising N first shift registers arranged alternately with N second shift registers,
wherein the N first shift registers are cascaded-coupled as N stages of first shift registers, and are configured to generate N first output signals under control of K first clock signals; and
wherein the N second shift registers are cascaded-coupled as N stages of second shift registers, and are configured to generate N second output signals under a control of K second clock signals,
wherein K and N are both integers greater than 1, and K<N;
wherein an input signal terminal of an n-th stage of first shift register in the N stages of first shift registers is coupled to an output signal terminal of an (n−i)-th stage of first shift register in the N stages of first shift registers, and a reset signal terminal of the n-th stage of first shift register is coupled to an output signal terminal of an (n+j)-th stage of first shift register in the N stages of first shift registers; and
wherein an input signal terminal of an n-th stage of second shift register in the N stages of second shift registers is coupled to an output signal terminal of an (n−i)-th stage of second shift register in the N stages of second shift registers, and a reset signal terminal of the n-th stage of second shift register is coupled to an output signal terminal of an (n+j)-th stage of second shift register in the N stages of second shift registers, wherein n, i, and j are all integers greater than 0, K is an even number, 1<n<N, 1≤i≤K/2, and K/2+1≤j≤K−1.

13. A method of driving a gate driving circuit, wherein the gate driving circuit comprising 2×N stages of shift registers, the 2×N stages of shift registers comprising N first shift registers arranged alternately with N second shift registers, wherein the N first shift registers are cascaded-coupled as N stages of first shift registers, and are configured to generate N first output signals under control of K first clock signals; and wherein the N second shift registers are cascaded-coupled as N stages of second shift registers, and are configured to generate N second output signals under a control of K second clock signals, wherein K and N are both integers greater than 1, and K<N; wherein an input signal terminal of an n-th stage of first shift register in the N stages of first shift registers is coupled to an output signal terminal of an (n−i)-th stage of first shift register in the N stages of first shift registers, and a reset signal terminal of the n-th stage of first shift register is coupled to an output signal terminal of an (n−j)-th stage of first shift register in the N stages of first shift registers: and wherein an input signal terminal of an n-th stage of second shift register in the N stages of second shift registers is coupled to an output signal terminal of an (n−i)-th stage of second shift register in the N stages of second shift registers, and a reset signal terminal of the n-th stage of second shift register is coupled to an output signal terminal of an (n−j)-th stage of second shift register in the N stages of second shift registers, wherein n, i, and j are all integers greater than 0, K is an even numbers, 1<n<N, 1≤i≤K/2 and K/2+1≤j≤K−1, the method comprising:

in a first mode, turning on the 2×N stages of shift registers, so that the N first shift registers of the 2×N stages of shift registers generate the N first output signals under control of the K first clock signals and the N second shift registers of the 2×N stages of shift registers generate the N second output signals under control of the K second clock signals; and in a second mode, turning on the N first shift registers so that the N first shift registers generate the N first output signals under control of the K first clock signals, wherein the N first output signals are shifted sequentially, or turning on the N second shift registers in the second mode so that the N second shift registers generate the N second output signals under control of the K second clock signals, wherein the N second output signals are shifted sequentially.

14. The method of claim 13, wherein, in the second mode, the turning on the N first shift registers comprises: applying a valid first turn-on signal to the first to i-th stages of first shift registers in the N first shift registers, and applying an invalid second turn-on signal to the first to i-th stages of second shift registers in the N second shift registers; and the turning on the N second shift registers comprises: applying a valid second turn-on signal to the first to i-th stages of second shift registers in the N second shift registers, and applying an invalid first turn-on signal to the first to i-th stages of first shift registers in the N first shift registers, wherein i is an integer and 1≤i≤K/2.

* * * * *

UNITED STATES PATENT AND TRADEMARK OFFICE
CERTIFICATE OF CORRECTION

PATENT NO. : 11,568,778 B2
APPLICATION NO. : 17/351638
DATED : January 31, 2023
INVENTOR(S) : Yingmeng Miao et al.

It is certified that error appears in the above-identified patent and that said Letters Patent is hereby corrected as shown below:

On the Title Page

Item (72), Line 10, please replace the word "Changchen" with the word --Changcheng--.

Signed and Sealed this
Sixteenth Day of May, 2023

Katherine Kelly Vidal
*Director of the United States Patent and Trademark Office*